(12) United States Patent
Lee et al.

(10) Patent No.: US 10,475,972 B2
(45) Date of Patent: Nov. 12, 2019

(54) LIGHT-EMITTING DIODE PACKAGE AND METHOD OF MANUFACTURING THE SAME

(71) Applicant: Samsung Electronics Co., Ltd., Suwon-si (KR)

(72) Inventors: Jin-sub Lee, Hwaseong-si (KR); Yong-il Kim, Hwaseong-si (KR); Han-kyu Seong, Hwaseong-si (KR); Young-jin Choi, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/192,864

(22) Filed: Nov. 16, 2018

(65) Prior Publication Data
US 2019/0088839 A1  Mar. 21, 2019

Related U.S. Application Data

(63) Continuation of application No. 15/703,098, filed on Sep. 13, 2017, now Pat. No. 10,164,159.

(30) Foreign Application Priority Data

Dec. 20, 2016 (KR) .......................... 10-2016-0174771
Mar. 13, 2017 (KR) .......................... 10-2017-0031357

(51) Int. Cl.
*H01L 33/58* (2010.01)
*H01L 33/60* (2010.01)
(Continued)

(52) U.S. Cl.
CPC .............. *H01L 33/58* (2013.01); *F21K 9/233* (2016.08); *F21K 9/237* (2016.08); *F21K 9/27* (2016.08); *G09F 13/00* (2013.01); *H01L 33/486* (2013.01); *H01L 33/502* (2013.01); *H01L 33/60* (2013.01); *H01L 33/62* (2013.01); *F21K 9/232* (2016.08); *F21K 9/275* (2016.08); *F21S 8/026* (2013.01); *F21V 23/045* (2013.01);
(Continued)

(58) Field of Classification Search
None
See application file for complete search history.

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

JP  2004-260048  9/2004
JP  2011-103382  5/2011
KR  10-1553341  7/2015

*Primary Examiner* — Joe E. Schoenholtz
(74) *Attorney, Agent, or Firm* — Muir Patent Law, PLLC

(57) ABSTRACT

A light-emitting diode (LED) package includes: a reflective structure including a cavity, a bottom portion having a through hole, and a sidewall portion surrounding the cavity and the bottom portion and having an inclined inner side surface; an electrode pad inserted into the through hole; an LED on the bottom portion in the cavity, the LED including a light-emitting structure electrically connected to the electrode pad and a phosphor formed on the light-emitting structure; and a lens structure filling the cavity and formed on the reflective structure.

20 Claims, 20 Drawing Sheets

(51) Int. Cl.

| | | |
|---|---|---|
| *F21K 9/237* | (2016.01) | |
| *H01L 33/50* | (2010.01) | |
| *H01L 33/62* | (2010.01) | |
| *H01L 33/48* | (2010.01) | |
| *F21K 9/233* | (2016.01) | |
| *F21K 9/27* | (2016.01) | |
| *G09F 13/00* | (2006.01) | |
| *H01L 33/30* | (2010.01) | |
| *H01L 33/32* | (2010.01) | |
| *H01L 33/06* | (2010.01) | |
| *F21V 8/00* | (2006.01) | |
| *G02F 1/1335* | (2006.01) | |
| *F21K 9/232* | (2016.01) | |
| *F21K 9/275* | (2016.01) | |
| *F21Y 115/10* | (2016.01) | |
| *F21S 8/02* | (2006.01) | |
| *F21V 23/04* | (2006.01) | |
| *F21Y 103/10* | (2016.01) | |

(52) U.S. Cl.
CPC ....... *F21Y 2103/10* (2016.08); *F21Y 2115/10* (2016.08); *G02B 6/0073* (2013.01); *G02F 1/133514* (2013.01); *H01L 33/06* (2013.01); *H01L 33/30* (2013.01); *H01L 33/32* (2013.01); *H01L 33/505* (2013.01); *H01L 2933/0041* (2013.01); *H01L 2933/0058* (2013.01); *H01L 2933/0066* (2013.01)

(56) References Cited

U.S. PATENT DOCUMENTS

| | | | |
|---|---|---|---|
| RE38,466 E | | 3/2004 | Inoue et al. |
| 6,818,465 B2 | | 11/2004 | Biwa et al. |
| 6,818,530 B2 | | 11/2004 | Shimoda et al. |
| 6,858,081 B2 | | 2/2005 | Biwa et al. |
| 6,967,353 B2 | | 11/2005 | Suzuki et al. |
| 7,002,182 B2 | | 2/2006 | Okuyama et al. |
| 7,084,420 B2 | | 8/2006 | Kim et al. |
| 7,087,932 B2 | | 8/2006 | Okuyama et al. |
| 7,154,124 B2 | | 12/2006 | Han et al. |
| 7,208,725 B2 | | 4/2007 | Sherrer et al. |
| 7,288,758 B2 | | 10/2007 | Sherrer et al. |
| 7,319,044 B2 | | 1/2008 | Han et al. |
| 7,501,656 B2 | | 3/2009 | Han et al. |
| 7,709,857 B2 | | 5/2010 | Kim et al. |
| 7,759,140 B2 | | 7/2010 | Lee et al. |
| 7,781,727 B2 | | 8/2010 | Sherrer et al. |
| 7,790,482 B2 | | 9/2010 | Han et al. |
| 7,940,350 B2 | | 5/2011 | Jeong |
| 7,959,312 B2 | | 6/2011 | Yoo et al. |
| 7,964,881 B2 | | 6/2011 | Choi et al. |
| 7,985,973 B2 | | 7/2011 | Chen |
| 7,985,976 B2 | | 7/2011 | Choi et al. |
| 7,994,525 B2 | | 8/2011 | Lee et al. |
| 8,008,683 B2 | | 8/2011 | Choi et al. |
| 8,013,352 B2 | | 9/2011 | Lee et al. |
| 8,043,876 B2 | * | 10/2011 | Lee .......... B29C 43/18 438/110 |
| 8,049,161 B2 | | 11/2011 | Sherrer et al. |
| 8,129,711 B2 | | 3/2012 | Kang et al. |
| 8,179,938 B2 | | 5/2012 | Kim |
| 8,263,987 B2 | | 9/2012 | Choi et al. |
| 8,324,646 B2 | | 12/2012 | Lee et al. |
| 8,399,944 B2 | | 3/2013 | Kwak et al. |
| 8,432,511 B2 | | 4/2013 | Jeong |
| 8,459,832 B2 | | 6/2013 | Kim |
| 8,502,242 B2 | | 8/2013 | Kim |
| 8,536,604 B2 | | 9/2013 | Kwak et al. |
| 8,735,931 B2 | | 5/2014 | Han et al. |
| 8,766,295 B2 | | 7/2014 | Kim |
| 9,887,330 B2 | | 2/2018 | Park et al. |
| 2008/0054279 A1 | | 3/2008 | Hussell et al. |
| 2012/0313115 A1 | | 12/2012 | Joo et al. |
| 2012/0313125 A1 | | 12/2012 | Odnoblyudov et al. |
| 2013/0315533 A1 | * | 11/2013 | Tay .......... H01L 31/16 385/31 |
| 2014/0117396 A1 | * | 5/2014 | Eisert .......... H01L 33/44 257/98 |
| 2015/0102374 A1 | | 4/2015 | Schmidtke et al. |
| 2015/0221835 A1 | | 8/2015 | Tischler et al. |
| 2016/0079487 A1 | | 3/2016 | Kuroki |
| 2016/0293810 A1 | | 10/2016 | Baike et al. |
| 2016/0351760 A1 | | 12/2016 | Hayashi et al. |
| 2017/0062663 A1 | | 3/2017 | Hayashi |
| 2017/0207376 A1 | * | 7/2017 | Kimura .......... H01L 33/502 |
| 2017/0317253 A1 | | 11/2017 | Lee et al. |
| 2018/0019386 A1 | | 1/2018 | Lee et al. |
| 2018/0040786 A1 | | 2/2018 | Chen |
| 2018/0040789 A1 | | 2/2018 | Kim |
| 2019/0123213 A1 | * | 4/2019 | Yu .......... H01L 31/1876 |

\* cited by examiner

LIGHT-EMITTING DIODE PACKAGE AND METHOD OF MANUFACTURING THE SAME

CROSS-REFERENCE TO RELATED APPLICATION

This application is a divisional application of U.S. patent application Ser. No. 15/620,870, filed Jun. 13, 2017, the disclosure which is incorporated herein in its entirety by reference, and which claims the benefits of priority under 35 U.S.C. 119 to Korean Patent Application No. 10-2016-0174771, filed on Dec. 20, 2016, and Korean Patent Application No. 10-2017-0031357, filed on Mar. 13, 2017, in the Korean Intellectual Property Office, the disclosures of both which are incorporated herein in their entireties by reference.

BACKGROUND

The present disclosure relates to a light-emitting diode (LED) package and a method of manufacturing the LED package, and more particularly, to an LED package including a reflective structure and a method of manufacturing the LED package including the reflective structure.

An LED package may include a reflective structure disposed around an LED to improve extraction efficiency of light emitted from the LED. As the size of the LED decreases, there is a demand for an LED package including a stable reflective structure that may effectively increase light extraction efficiency.

SUMMARY

The present disclosure provides a chip scale light-emitting diode (LED) package including a reflective structure capable of effectively improving light extraction efficiency.

The present disclosure also provides a method of manufacturing the chip scale LED package.

Additional aspects will be set forth in part in the description which follows and, in part, will be apparent from the description, or may be learned by practice of the presented exemplary embodiments.

According to an aspect of the present disclosure, there is provided a light-emitting diode (LED) package including: a reflective structure including a cavity, a bottom portion having a through hole, and a sidewall portion surrounding the cavity and the bottom portion, the sidewall portion having an inclined inner side surface; an electrode pad in the through hole; an LED on the bottom portion in the cavity, the LED including a light-emitting structure electrically connected to the electrode pad and a phosphor formed on the light-emitting structure; and a lens structure filling the cavity and formed on the reflective structure.

According to an aspect of the present disclosure, there is provided a method of manufacturing a light-emitting diode (LED) package, the method including: preparing a mold defined to include a plurality of shapes of a reflective structure including a cavity, a bottom portion having a through hole, and a sidewall portion surrounding the cavity and the bottom portion, the sidewall portion having an inclined inner side surface; forming a reflective structure panel including a plurality of reflective structures by using the mold; forming an electrode pad in a through hole formed in a bottom portion of each of the plurality of reflective structures; arranging an LED on the bottom portion of each of the plurality of reflective structures, the LED including a light-emitting structure electrically connected to the electrode pad and a phosphor formed on the light-emitting structure; and forming a lens structure filling the cavity, the lens structure including a microlens on each of the plurality of reflective structures.

According to an aspect of the present disclosure, there is provided a light-emitting diode (LED) package including: a reflective structure comprising a cavity, a bottom portion having a first through hole and a second through hole spaced apart from the first through hole, and a sidewall portion surrounding the cavity and the bottom portion, the sidewall portion having an inclined inner side surface; a first electrode pad in the first through hole and a second electrode pad in the second through hole; an LED extending on the bottom portion, the LED comprising a first conductivity-type semiconductor layer, an active layer, a second conductivity-type semiconductor layer, and a phosphor sequentially stacked on the bottom portion, the first conductivity-type semiconductor layer is connected to the first electrode pad and the second conductivity-type semiconductor layer is connected to the second electrode pad; and a lens structure filling the cavity and formed on the reflective structure.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1A:
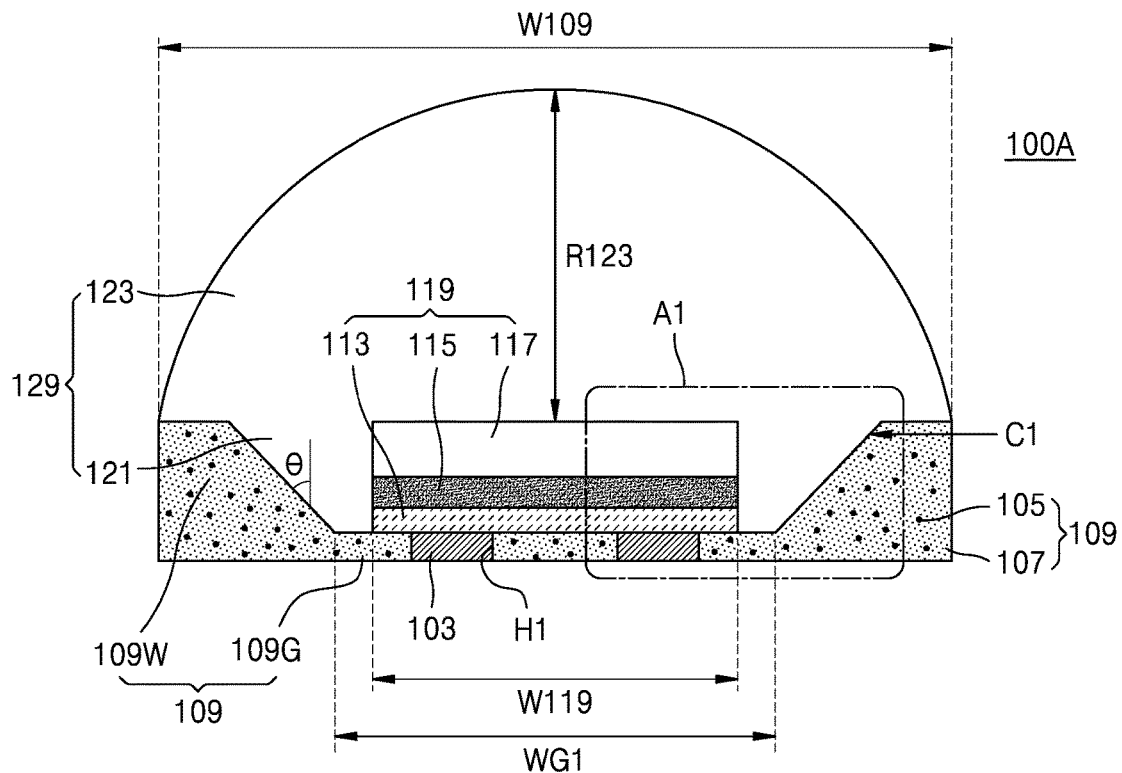
FIG. 1A is a cross-sectional view of a light-emitting diode (LED) package according to an exemplary embodiment of the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Figure 1B:
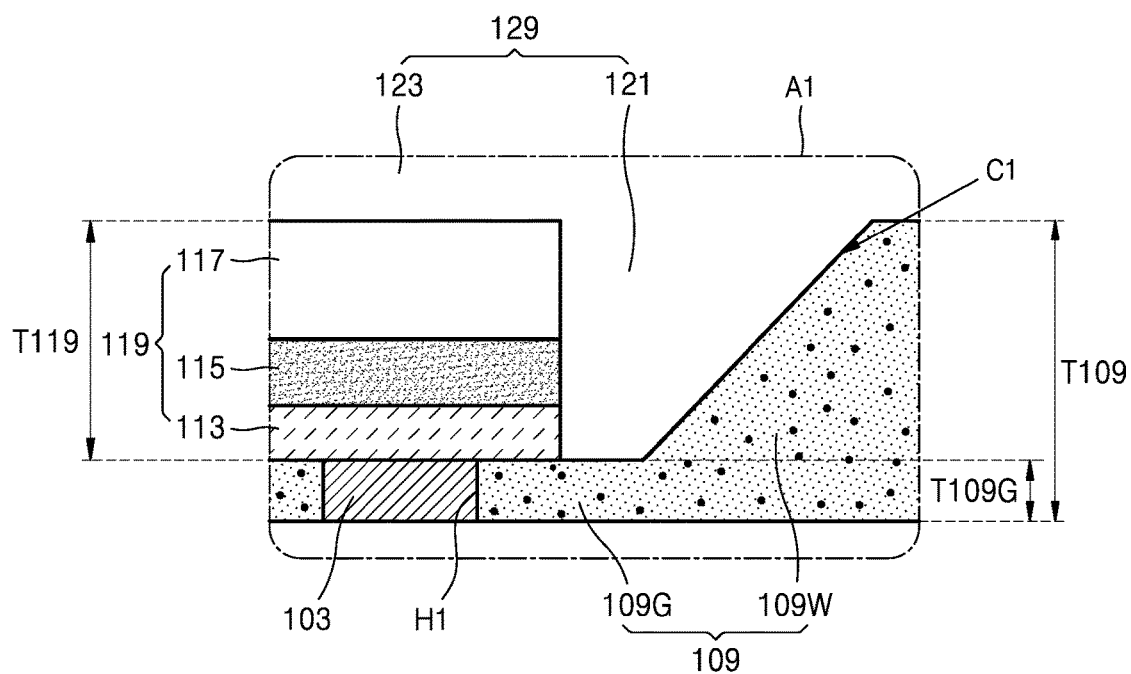
FIG. 1B is an enlarged view of a part A1 of FIG. 1A.

FIG. 1A is a cross-sectional view of a light-emitting diode (LED) package 100A according to an exemplary embodiment of the present disclosure. FIG. 1B is an enlarged view of a part A1 of FIG. 1A.

Referring to FIGS. 1A and 1B, the LED package 100A may include a reflective structure 109 having a cavity C1, an LED 119 disposed in the cavity C1, and a lens structure 129 formed in a hemispherical shape on the reflective structure 109 while filling the inside of the cavity C1.

Specifically, the reflective structure 109 may include a bottom portion 109G and a sidewall portion 109W surrounding the bottom portion 109G and having an inclined inner side surface. The bottom portion 109G may have a through hole H1 through which an electrode pad 103 penetrates. The inclined inner side surface of the sidewall portion 109W may include, for example, a side surface that joins the uppermost surface of the bottom portion 109G to the uppermost surface of the sidewall portion 109W, and may be referred to simply as an inclined surface. The reflective structure 109 may have a bowl shape, at least for a portion of the upper-most surface of the structure, and thus may be referred to as a reflective, bowl-shaped structure.

The reflective structure 109 may be formed by a molding process using a mold. Therefore, since the reflective structure 109 may be implemented as it is, according to a shape defined by the mold, a desired final structure may be stably secured.

For example, the size of the cavity C1 may be easily adjusted by using a mold, which corresponds to the size of the LED 119, as a mold for defining the cavity C1 in the molding process. In some embodiments, a width WG1 of the bottom portion 109G in a first direction parallel to the bottom surface of the bottom portion 109G or the bottom surface of the reflective structure 109 may be greater than a width W119 of the LED 119 in the first direction by a predetermined interval left and right on the cross-sectional view. In some embodiments, a thickness T109 of the reflective structure 109 in a second direction perpendicular to the bottom surface of the bottom portion 109G or the bottom surface of the reflective structure 109 may be substantially equal to the sum of a thickness T109G of the bottom portion 109G and a thickness T119 of the LED 119 in the second direction. Also, in some embodiments, the width WG1 of the bottom portion 109G may be about 1.0 to about 2.0 times the width W119 of the LED 119. In a multi-chip structure in which a plurality of LEDs 119 are mounted, the width WG1 of the bottom portion 109G may be about 1.0 to about 2.0 times the sum of widths W119 of the plurality of LEDs 119.

According to exemplary embodiments, the LED package 100A may be miniaturized by minimizing the volume of the reflective structure 109 while minimizing a space occupied by the cavity C1.

By using a mold, which corresponds to an inclination angle that may provide the maximum light extraction efficiency of light emitted from the LED 119, as a mold for defining an inclination angle θ of the inner side surface of the sidewall portion 109W in the molding process, light reflection efficiency by the reflective structure 109 may be maximized. In some embodiments, the inclination angle θ of the inner side surface of the sidewall portion 109W may be about 45° to about 55°, but the disclosure is not limited thereto. Accordingly, the light extraction efficiency of the LED package 100A may be maximized.

The reflective structure 109 may include a resin 107 and a highly reflective powder 105 dispersed within the resin 107. The highly reflective powder 105 may reflect light generated by the LED 119 and thus may suppress light loss and enhance light extraction efficiency in extracting light generated from the side surface of the LED 119. The reflective structure 109 may be a single piece, e.g., formed by a mold, and may thus include a continuous, integrated structure.

In some embodiments, the highly reflective powder 105 may include a metal powder having high reflectivity, for example, a powder such as Al or Ag. The metal powder may be appropriately contained in such a range that the reflective structure 109 is maintained as an insulator. In addition, the highly reflective powder 105 may include a ceramic powder having relatively high reflectivity, for example, a powder such as $TiO_2$, $Al_2O_3$, $Nb_2O_5$, or ZnO. In some embodiments, the resin 107 may include an epoxy resin having high reflectance and a white color, a silicone resin, a polyester resin, or the like.

The electrode pad 103 may be disposed in the through hole H1 included in the bottom portion 109G of the reflective structure 109. The bottom surface of the electrode pad 103 is formed in substantially the same plane as the bottom surface of the bottom portion 109G of the reflective structure 109. However, the present disclosure is not limited thereto and the electrode pad 103 may be arranged in various shapes.

In some embodiments, the electrode pad 103 may include a conductive material such as Ag, Ni, Al, Rh, Pd, Ir, Ru, Mg, Zn, Pt, or Au and may have a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt. In some embodiments, the electrode pad 103 may include a seed layer formed of a metal material such as Ni or Cr, and an electrode material layer formed of a metal material such as Au through a plating process using the seed layer as a seed.

The LED 119 may include a light-emitting structure 113 electrically connected to the electrode pad 103, a phosphor 115 formed on the light-emitting structure 113, and a support substrate 117 formed on the phosphor 115. For example, the phosphor 115 is provided between the light-emitting structure 113 and the support substrate 117 in a manner such that the uppermost surface of the phosphor 115 contacts the lowermost surface of the support structure 117 and the lowermost surface of the phosphor 115 contacts the upper most surface of the light-emitting structure 113. In some embodiments, the uppermost surface of the phosphor 115 is substantially coplanar with the lowermost surface of the support structure 117 and the lowermost surface of the phosphor 115 is substantially coplanar with the upper most surface of the light-emitting structure 113.

The light-emitting structure 113 may have a structure in which a first conductivity-type semiconductor layer, an active layer, and a second conductivity-type semiconductor layer are sequentially stacked. The light-emitting structure 113 will be described in detail with reference to FIG. 1C later.

The phosphor 115 may be formed on the light-emitting structure 113. The phosphor 115 may include a resin containing a wavelength conversion material. For example, the wavelength conversion material may be a fluorescent material, and the resin may be a silicone resin, an epoxy resin, or a mixed resin thereof. The phosphor 115 may have electrically insulating properties.

The phosphor 115 may include two or more materials that provide light of different wavelengths. In some embodiments, the phosphor 115 may include a mixture of a green fluorescent powder and a red fluorescent powder. In some other embodiments, the phosphor 115 may have a structure in which a plurality of wavelength conversion layers are stacked. For example, the phosphor 115 may have a structure in which a first wavelength conversion layer outputting green light and a second wavelength conversion layer outputting red light are stacked, but the wavelength conversion layers of the structure of the phosphor 115 are not limited to outputting the green light and red light. Accordingly, the phosphor 115 may convert light generated from the light-emitting structure 113 into white light or light having a specific wavelength.

In some embodiments, the level of the top surface of the phosphor 115 in a direction perpendicular to the bottom surface of the reflective structure 109 may be lower than the level of the top surface of the reflective structure 109 in the direction perpendicular to the bottom surface of the reflective structure 109. Due to such a structure, light emitted from the light-emitting structure 113 and output through the phosphor 115, for example, white light, may be reflected through the reflective structure 109, and thus, light extraction efficiency may be improved.

In some embodiments, the side surface of the light-emitting structure 113 and the side surface of the phosphor 115 may be positioned in the substantially the same plane. This is a structural feature due to a manufacturing method of the LED 119, and the structural feature may be obtained as a cutting process is performed in a state where the phosphor 115 is formed on the light-emitting structure 113. For example, mass production of the LED package 100A may be more easily achieved by efficiently managing a manufacturing process of the LED 119.

The support substrate 117 may be formed on the phosphor 115. The support substrate 117 may be disposed on the phosphor 115 to support the LED 119. The support substrate 117 may receive heat, generated from the light-emitting structure 113, through the phosphor 115 and may discharge the received heat to the outside of the LED package 100A. In addition, the support substrate 117 may have light transmission properties (e.g., the support substrate 117 may be transparent or translucent). The support substrate 117 may have light transmission properties when a light-transmitting material is used or when the thickness thereof is less than a predetermined thickness capable of transmitting light.

As the support substrate 117, an insulating, conductive, or semiconductor substrate may be used if necessary. The support substrate 117 may include, for example, $Al_2O_3$, GaN, Si, Ge, GaAs, ZnO, SiGe, SiC, $Ga_2O_3$, $LiGaO_2$, $LiAlO_2$, or $MgAl_2O_4$. In some embodiments, an $Al_2O_3$, Si, or SiC substrate is mainly used as the support substrate 117.

In some embodiments, the support substrate 117 may be removed completely or partially during fabrication of the LED 119 to enhance optical or electrical characteristics of the LED 119 either before or after the formation of the light-emitting structure 113.

When the support substrate 117 is an $Al_2O_3$ substrate, the support substrate 117 may be removed by irradiating a laser beam to an interface with the phosphor 115 through the support substrate 117. When the support substrate 117 is a Si substrate or a SiC substrate, the support substrate 117 may be removed by polishing or etching.

In some embodiments, when the support substrate 117 is an $Al_2O_3$ substrate, the $Al_2O_3$ substrate includes crystals having hexagonal-rhombo symmetry, in which a lattice constant in the c-axis direction and a lattice constant in the a-axis direction are 13.001 Å and 4.758 Å, respectively, and has a C(0001) plane, an A(1120) plane, and an R(1102) plane. In this exemplary embodiment, since it is relatively easy to grow a nitride thin film on the C(0001) plane and the C(0001) plane is stable at high temperature, the $Al_2O_3$ substrate is mainly used as a substrate for nitride growth.

In some other embodiments, when the support substrate 117 is a Si substrate, mass productivity may be improved since the Si substrate is more suitable for large diameter and relatively low in cost. The Si substrate having a (111) plane as a substrate surface may have a lattice constant difference of about 17% with gallium nitride.

In some embodiments, the side surface of the light-emitting structure 113, the phosphor 115, and the side surface of the support substrate 117 may be positioned in substantially the same plane. This is a structural feature due to a manufacturing method of the LED 119 and makes it possible to more easily achieve mass production of the LED package 100A.

The lens structure 129 may have a first region 121 formed in the cavity C1 and a second region 123 formed outside the cavity C1.

The first region 121 of the lens structure 129 may include a light-transmitting material (e.g., a light-transmitting layer) and may seal the LED 119 in the cavity C1. For example, the first region 121 of the lens structure 129 may completely cover the upper surface (e.g., top surface) and opposite side surfaces of the LED 119. The light-transmitting material may protect the LED 119 from an external environment. The light-transmitting material may be a transparent organic material such as epoxy, silicon, or a hybrid of epoxy and silicone, and the light-transmitting material may be cured by heating, light irradiation, time lapse, or the like.

The second area 123 of the lens structure 129 may be a microlens formed on the reflective structure 109. The microlens may be formed in a hemispherical shape to exhibit a wide directivity angle. In FIG. 1A, the microlens is illustrated as having a hemispherical shape, but is not limited thereto. The microlens may have various surface shapes corresponding to an orientation angle required for the LED package 100A. In some embodiments, the microlenses may have various geometries such as concave, convex, unevenness, and cone, and light distribution characteristics may be modified according to the shape of the microlens.

The microlenses constituting the second region 123 and the light-transmitting material constituting the first region 121 may be formed of the same material (e.g., may have a same material composition such that both the first region 121 and the second region 123 consist of the same material or composition of materials) and integrally formed at the same time. The lens structure 129 may be formed, for example, by a compression molding method.

The radius R123 of the microlens constituting the second region 123 may be half the width W109 of the reflective structure 109 in a direction parallel to a bottom surface of the reflective structure 109. The center point of the microlens is not present only on the upper surface of the LED 119 as shown in FIG. 1A, but may be spaced apart from the upper surface of the LED 119. The brightness of the LED package 100A according to one embodiment of the present disclosure may vary according to the ratio of the radius R123 and the width W109. In order to realize the highest brightness, the radius R123 may be set to half the width W109. The brightness will be described in detail with reference to FIG. 6 later.

Figure 1C:
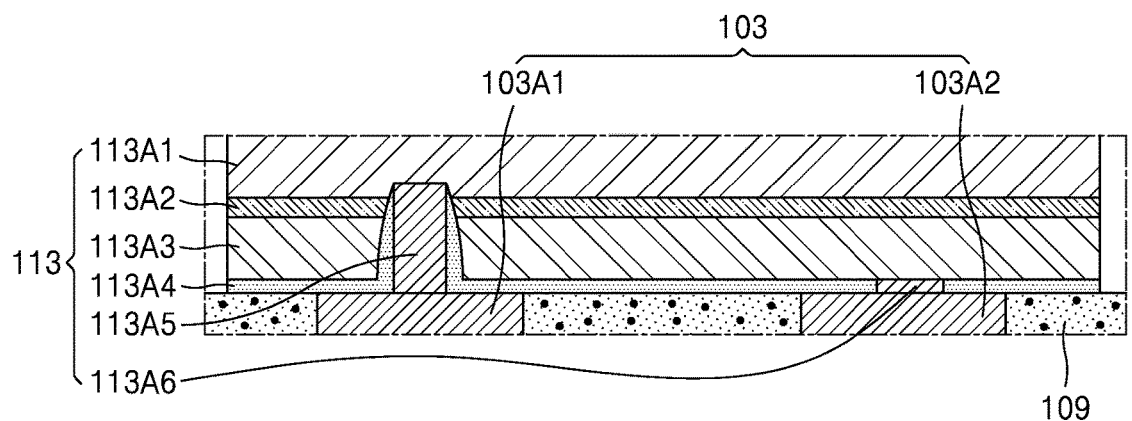
FIG. 1C is an enlarged view of a light-emitting structure and its periphery in FIG. 1A.

FIG. 1C is an enlarged view of the light-emitting structure 113 and its periphery in FIG. 1A.

Referring to FIG. 1C, the light-emitting structure 113 may have a structure in which a first conductivity-type semiconductor layer 113A1, an active layer 113A2, and a second conductivity-type semiconductor layer 113A3 are sequentially stacked. The first conductivity-type semiconductor layer 113A1 may include a semiconductor doped with p-type impurities, and the second conductivity-type semiconductor layer 113A3 may include a semiconductor doped with n-type impurities, but the disclosure is not limited thereto. For example, in some embodiments, the first conductivity-type semiconductor layer 113A1 may include a semiconductor doped with n-type impurities and the second conductivity-type semiconductor layer 113A3 may include a semiconductor doped with p-type impurities. The first and second conductivity-type semiconductor layers 113A1 and 113A3 may include a nitride semiconductor, for example, $Al_xIn_yGa_{(1-x-y)}N$ ($0 \le x < 1$, $0 \le y < 1$, $0 \le x+y < 1$). However, the first and second conductivity-type semiconductor layers 113A1 and 113A3 may include a GaAs-based semiconductor or a GaP-based semiconductor in addition to the nitride semiconductor. In some embodiments, the first conductivity-type semiconductor layer 113A1, the active layer 113A2, and the second conductivity-type semiconductor layer 113A3 may be epitaxial layers.

The active layer 113A2 interposed between the first and second conductivity-type semiconductor layers 113A1 and 113A3 may emit light having predetermined energy by recombination of electrons and holes. In some embodiments, the active layer 113A2 may have a multiple quantum well structure, e.g., an InGaN/GaN or AlGaN/GaN structure, in which a quantum well layer and a quantum barrier layer are alternately stacked. In some other embodiments, the active layer 113A2 may have a single quantum well structure. The light-emitting structure 113 may emit blue light, green light, red light, ultraviolet rays or the like depending on the material of a compound semiconductor forming the light-emitting structure 113. Unless otherwise specified, generic reference to blue light, green light and red light herein refers respectively to light having respective wavelengths of 420 nm to 480 nm, 500 nm to 600 nm and 630 nm to 780 nm. Unless otherwise specified, generic reference to a blue pixel, a green pixel and a red pixel refers to pixels that emit light having a peak intensity of blue light, green light and red light, respectively. However, the wavelength of light generated from the light-emitting structure 113 may be changed by the phosphor 115 (see FIG. 1A) formed on the light-emitting structure 113 and thus light of various colors may be output.

The light-emitting structure 113 may be electrically connected to the electrode pad 103. Specifically, the first and second conductivity-type semiconductor layers 113A1 and 113A3 may be connected to first and second electrode pads 103A1 and 103A2, respectively.

A first electrode 113A5 may be formed to penetrate the second conductivity-type semiconductor layer 113A3 and the active layer 113A2 and to be connected to the first conductivity-type semiconductor layer 113A1. An insulating layer 113A4 may be formed on the outer side wall of the first electrode 113A5 and the bottom surface of the second conductivity-type semiconductor layer 113A3 to prevent a direct electrical connection between the first electrode pad 103A1 and the active layer 113A2. The first electrode 113A5 may be electrically connected to the first electrode pad 103A1. In some embodiments, the upper surface of the first electrode 113A5 may be positioned at a level higher than the upper supper surface of the active layer 113A2. In some embodiments, a thickness of the insulating layer 113A4 in a direction parallel to the top surface of the first electrode pad 103A1 gradually decreases from the bottom surface of the first electrode 113A5 towards the top surface of the first electrode 113A5.

A second electrode 113A6 may be formed to penetrate the insulating layer 113A4 formed on the bottom surface of the second conductivity-type semiconductor layer 113A3 and to be connected to the second conductivity-type semiconductor layer 113A3. The second electrode 113A6 may be electrically connected to the second electrode pad 103A2. In some embodiments, a top surface of the second electrode 113A6 is positioned at a same level as the top surface of the insulating layer 113A4 and a bottom surface of the second electrode 113A6 is positioned at a same level as the bottom surface of the insulating layer 113A4.

FIG. 1C shows an example in which the first conductivity-type semiconductor layer 113A1, the active layer 113A2, the second conductivity-type semiconductor layer 113A3, the insulating layer 113A4, the first electrode 113A5, and the second electrode 113A6 constitute the light-emitting structure 113. However, the present disclosure is not limited thereto. In addition, the structure of an electrical connection between the light-emitting structure 113 and the electrode pad 103 is merely an example, and the present disclosure is not limited thereto.

In some embodiments, the light-emitting structure 113 may be an element that emits light with a predetermined energy, and the electrode pad 103 may have various structures that transmit energy to the light-emitting structure 113. For example, the first and second electrode pads 103A1 and 103A2 may be arranged in various shapes.

Figure 1D:
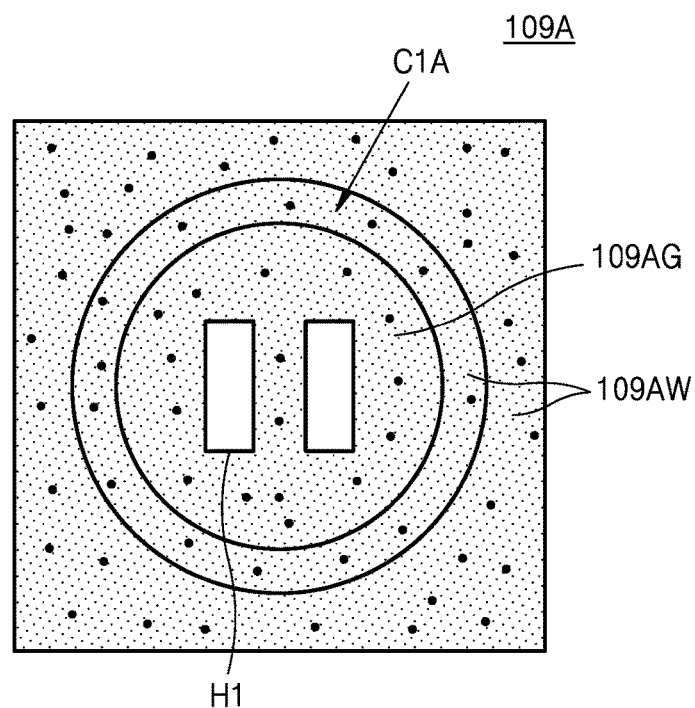
FIGS. 1D and 1E are plan views illustrating the shape of a reflective structure of FIG. 1A.
Figure 1E:
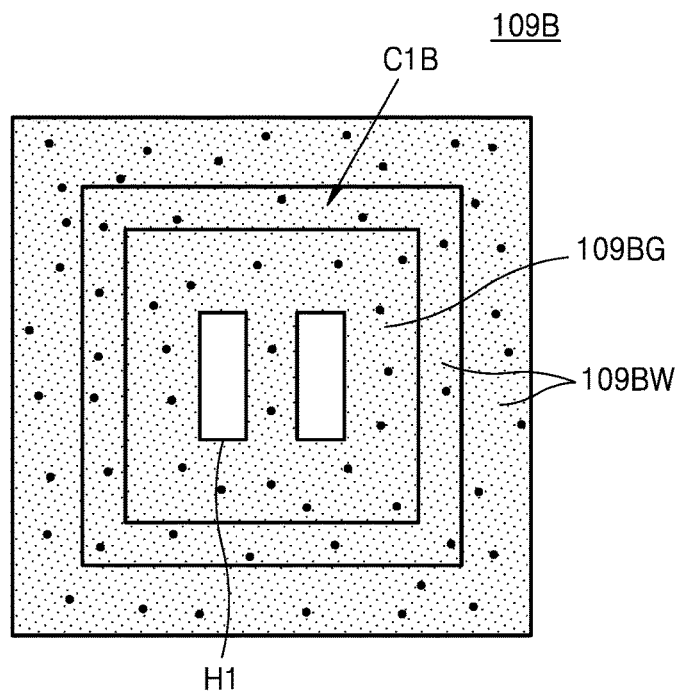

FIGS. 1D and 1E are plan views illustrating the shape of the reflective structure 109 of FIG. 1A.

Referring to FIGS. 1D and 1E, when the LED package 100A of FIG. 1A is viewed from above, the cavity C1 may be a circular cavity C1A (see FIG. 1D) having a circular horizontal cross-section or a square cavity C1B (see FIG. 1E) having a square horizontal cross-section. However, the present disclosure is not limited thereto, and the cavity C1 may have various shapes such as a square shape, in which a horizontal cross-section has rounded corners, or a rectangular shape.

The reflective structure 109A having the circular cavity C1A may include a circular bottom portion 109AG and a sidewall portion 109AW (see FIG. 1D), and the reflective structure 109B having the square cavity C1B may include a square bottom portion 109BG and a sidewall portion 109BW (see FIG. 1E). The shape of a through hole H1 into which the electrode pad 103 (see FIG. 1A) is inserted may be the same in the reflective structure 109A and the reflective structure 109B.

Figure 2A:
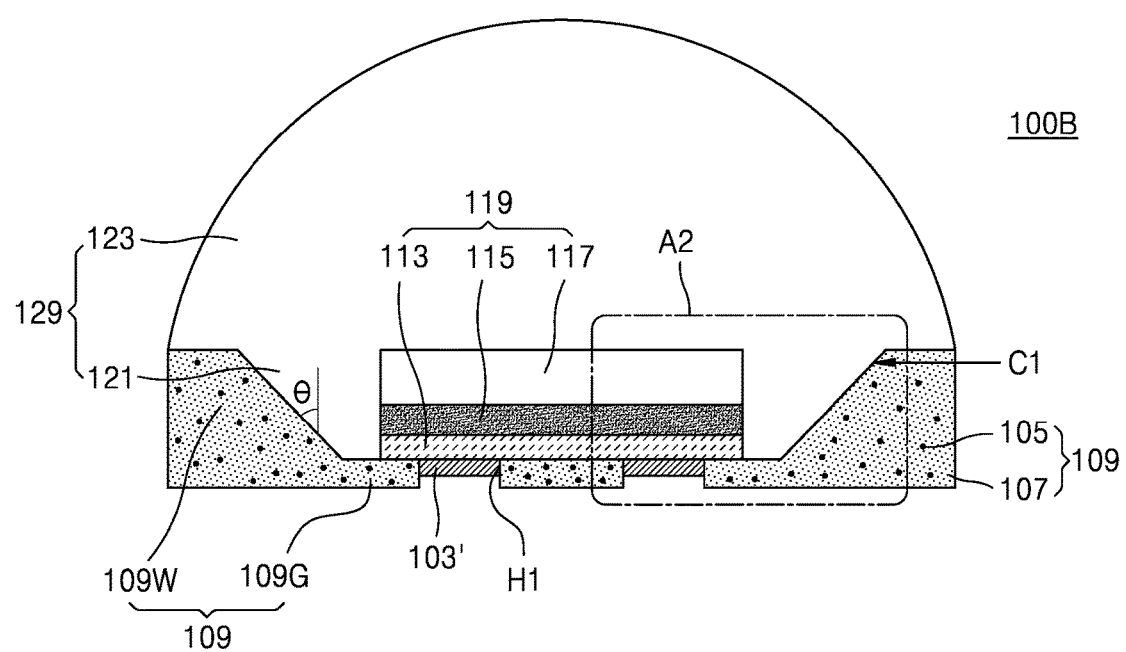
FIG. 2A is a cross-sectional view of an LED package according to an exemplary embodiment of the present disclosure.
Figure 2B:
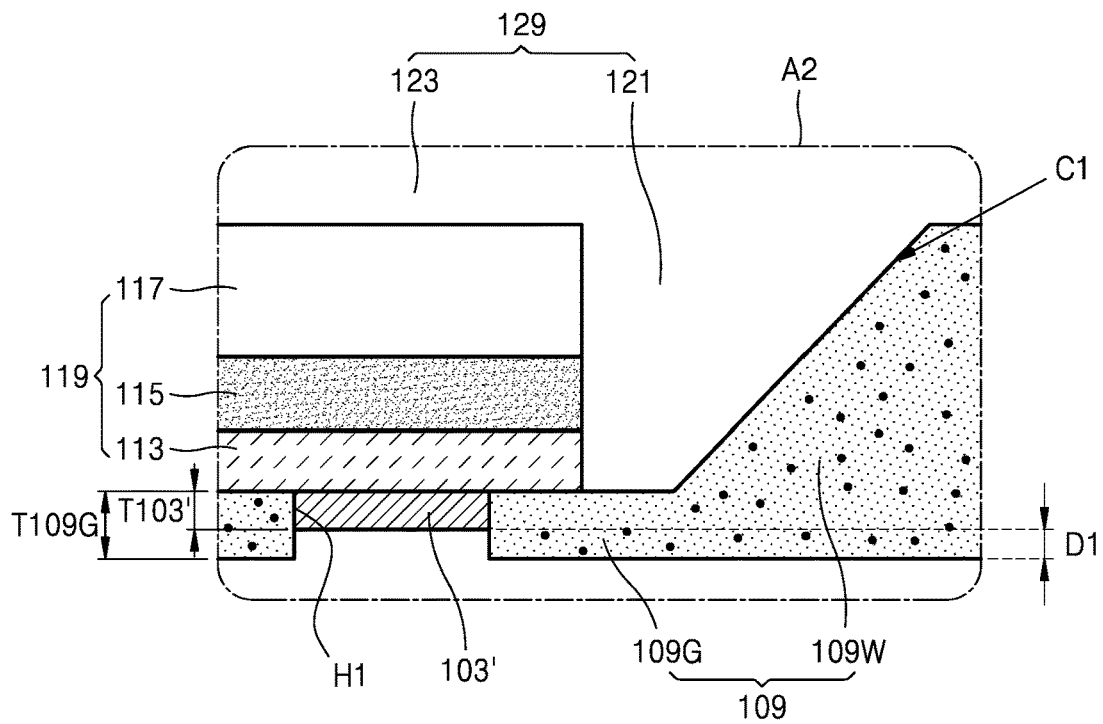
FIG. 2B is an enlarged view of a portion A2 in FIG. 2A.

FIG. 2A is a cross-sectional view of an LED package 100B according to an embodiment of the present disclosure. FIG. 2B is an enlarged view of a portion A2 in FIG. 2A.

Referring to FIGS. 2A and 2B, the LED package 100B is similar to the LED package 100A of FIGS. 1A and 1B except that the bottom surface of an electrode pad 103' is recessed from the bottom surface of a reflective structure 109 into a through hole H1. The same reference numerals as those in FIGS. 1A and 1B denote the same members, and repeated descriptions will be omitted for convenience of description.

The electrode pad 103' may be disposed in the reflective structure 109 so that the electrode pad 103' is inserted into the through hole H1. In this exemplary embodiment, the electrode pad 103' may be inserted only in a part of the through hole H1. For example, the bottom surface of the electrode pad 103' may be recessed from the bottom surface of the reflective structure 109 into the through hole H1. For example, as illustrated in FIG. 2B, the bottom surface of the electrode pad 103' may be positioned at a level higher than the bottom surface of the reflective structure 109. Thus, the thickness T109G of the bottom portion 109G of the reflective structure 109 in a direction perpendicular to the bottom surface of the reflective structure 109 may be greater than a thickness T103' of the electrode pad 103' in the direction perpendicular to the bottom surface of the reflective structure 109.

Such a structure may be caused by a manufacturing method in which the reflective structure 109 having the through hole H1 is formed in advance by a molding method prior to the arrangement of the electrode pad 103'. During a manufacturing process of the LED package 100B, the electrode pad 103' may be prevented from being damaged during the movement and placement of the LED package 100B by maintaining a distance D1 between the bottom surface of the electrode pad 103' and the bottom surface of the reflective structure 109.

The electrode pads (103, 103A1, 103A2, 103') may be LED package pads and form external terminals of the LED package (100A, 100B, 100C) to provide an electrical connection to an external system (e.g., a printed circuit board via solder bump connections to these LED package pads). For example, the various pads described herein may be conductive terminals connected to internal wiring of the LED package, and may transmit signals and/or supply voltages between an internal wiring and/or internal circuit of the LED package and an external source or to another device (e.g., another LED package or substrate). For example, the pads may electrically connect to and transmit supply voltages and/or signals between an integrated circuit of the LED package and a device to which the LED package is connected. The various pads may be provided on or near an external surface of the LED package and may generally have a planar surface area (often larger than a corresponding surface area of the internal wiring to which they are connected) to promote connection to a further terminal, such as a bump or solder ball, and/or an internal or external wiring.

Figure 3A:
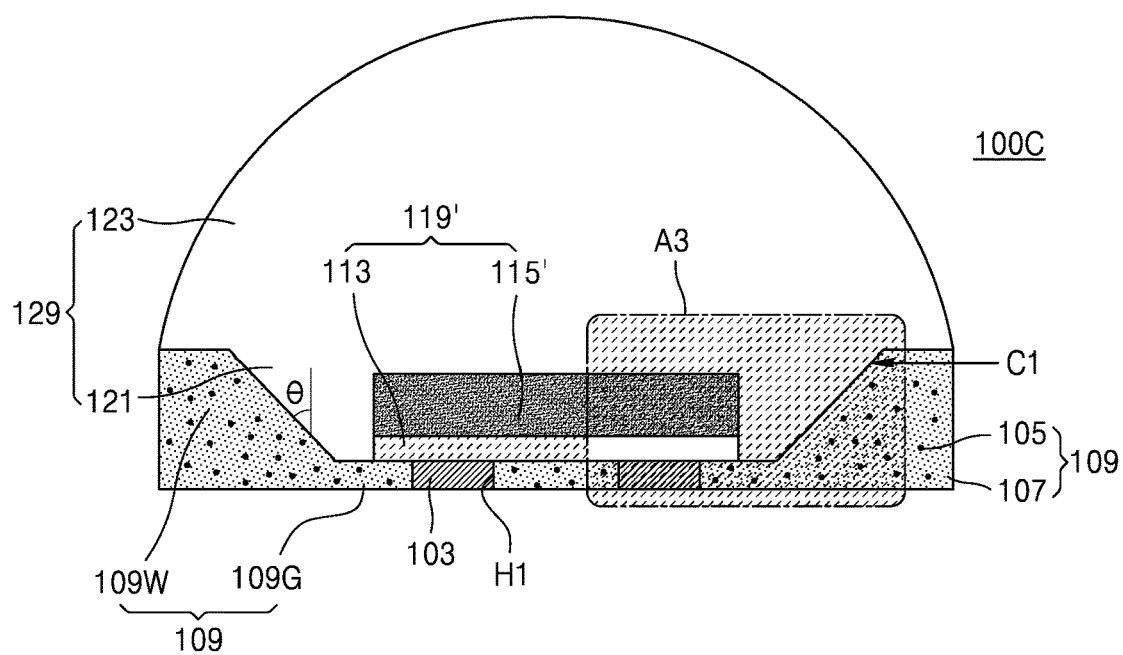
FIG. 3A is a cross-sectional view of an LED package according to an embodiment of the present disclosure.
Figure 3B:
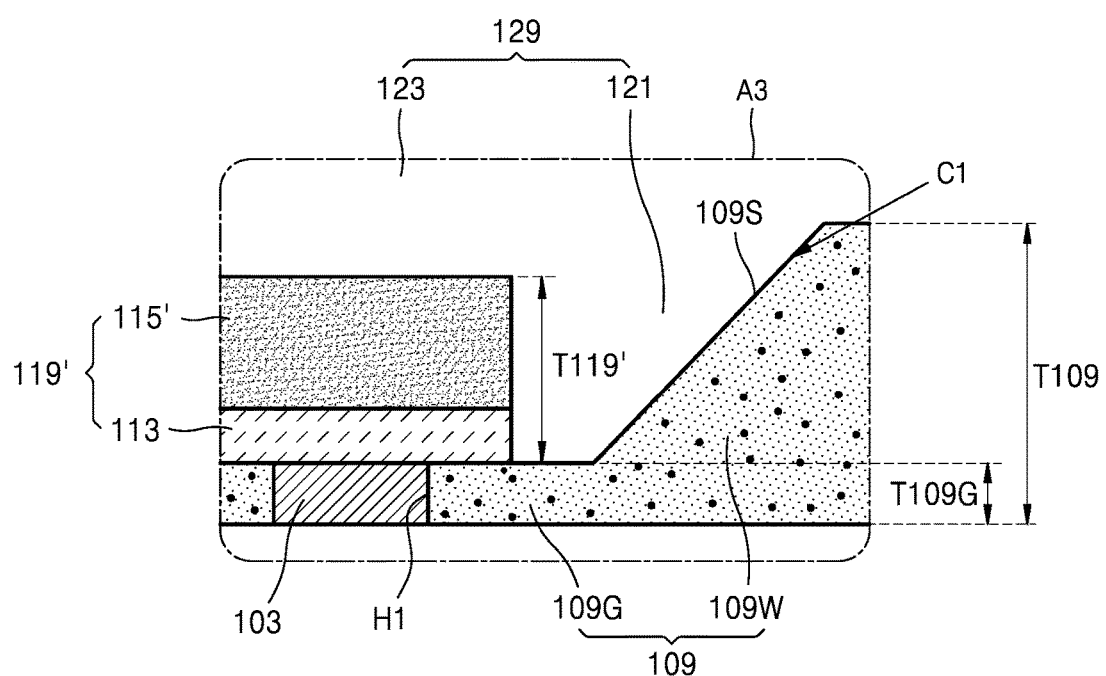
FIG. 3B is an enlarged view of a portion A3 in FIG. 3A.

FIG. 3A is a cross-sectional view of an LED package 100C according to an embodiment of the present disclosure. FIG. 3B is an enlarged view of a portion A3 in FIG. 3A.

Referring to FIGS. 3A and 3B, the LED package 100C is similar to the LED package 100A of FIGS. 1A and 1B except that the LED package 100C does not include a support substrate on an LED 119' and the thickness of a phosphor 115' in the LED package 100C is greater than that of the phosphor 115 in the LED package 100A. The same reference numerals as those in FIGS. 1A and 1B denote the same members, and repeated descriptions will be omitted for convenience of description.

A support substrate present on the phosphor 115' may be removed by the above-described removal process. For example, the support substrate may be completely removed in a manufacturing process of the LED 119' to improve optical characteristics or electrical characteristics of the LED 119' before or after the formation of the light-emitting structure 113.

In this exemplary embodiment, the phosphor 115 'may be a wavelength conversion layer of the LED 119' and serve as a support. Therefore, the phosphor 115' may be formed to have a thickness greater than that of the phosphor 115 in the LED package 100A in order to serve as a support.

In the LED package 100C according to one exemplary embodiment, the thickness T109 of the reflective structure 109 in a direction perpendicular to the bottom surface of the reflective structure 109 may be greater than the sum of the thickness T109G of the bottom portion 109G and the thickness T119' of the LED 119' in the direction perpendicular to the bottom surface of the reflective structure 109. For example, the level of the top surface of the phosphor 115' may be lower in a direction perpendicular to the bottom surface of the reflective structure 109 than the level of the top surface of the reflective structure 109 in the direction perpendicular to the bottom surface of the reflective structure 109. In addition, the sides of the light-emitting structure 113 and the phosphor 115' constituting the LED 119' may be positioned substantially in the same plane. Effects occurring due to this structural feature have been described above and will not be repeated herein.

Figure 4:
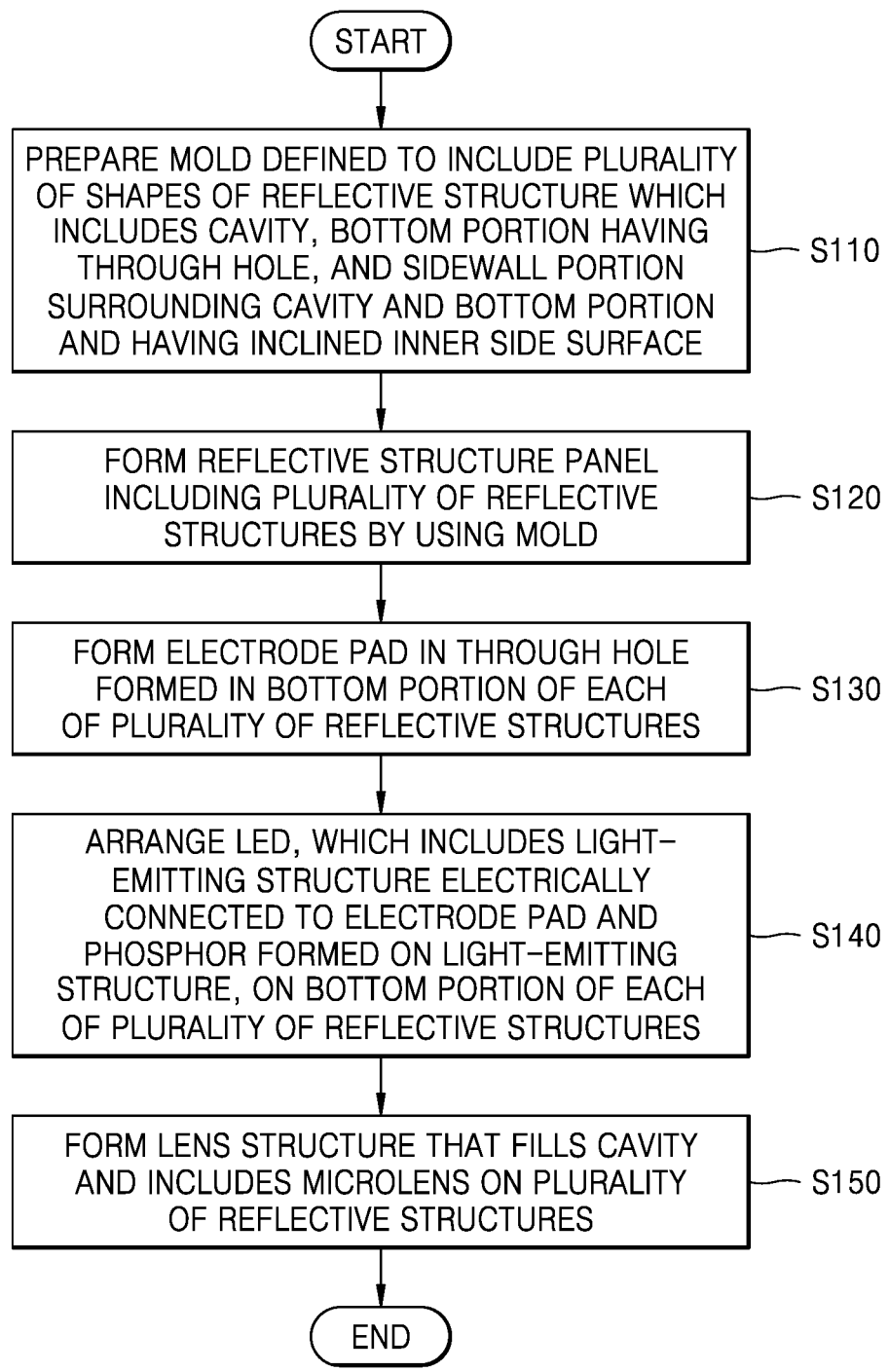
FIG. 4 is a flowchart illustrating a method of manufacturing an LED package, according to an exemplary embodiment of the present disclosure.

FIG. 4 is a flowchart illustrating a method of manufacturing an LED package, according to an exemplary embodiment of the present disclosure.

Referring to FIG. 4, the method of manufacturing the LED package may include the following process sequences. When a certain embodiment is otherwise feasible, a specific process sequence may be performed differently than the sequence described. For example, two processes that are described in succession may be performed substantially simultaneously, or may be performed in a reverse sequence of the sequence described.

The method may include preparing a mold defined to include a plurality of shapes of a reflective structure which includes a cavity, a bottom portion having a through hole, and a sidewall portion surrounding the cavity and the bottom portion and having an inclined inner side surface (Operation S110), forming a reflective structure panel including the plurality of reflective structures by using the mold (Operation S120), forming an electrode pad in the through hole formed in the bottom portion of each of the plurality of reflective structures (Operation S130), arranging an LED, which includes a light-emitting structure electrically connected to the electrode pad and a phosphor formed on the light-emitting structure, on the bottom portion of each of the plurality of reflective structures (Operation S140), and forming a lens structure that fills the cavity and includes a microlens on the plurality of reflective structures (Operation S150).

The technical features of each of Operations S110 to S150 will be described in detail with reference to FIGS. 5A to 5K to be described later.

FIGS. 5A to 5K are cross-sectional views illustrating a method of manufacturing the LED package 100A, according to an embodiment of the present disclosure.

Figure 5A:
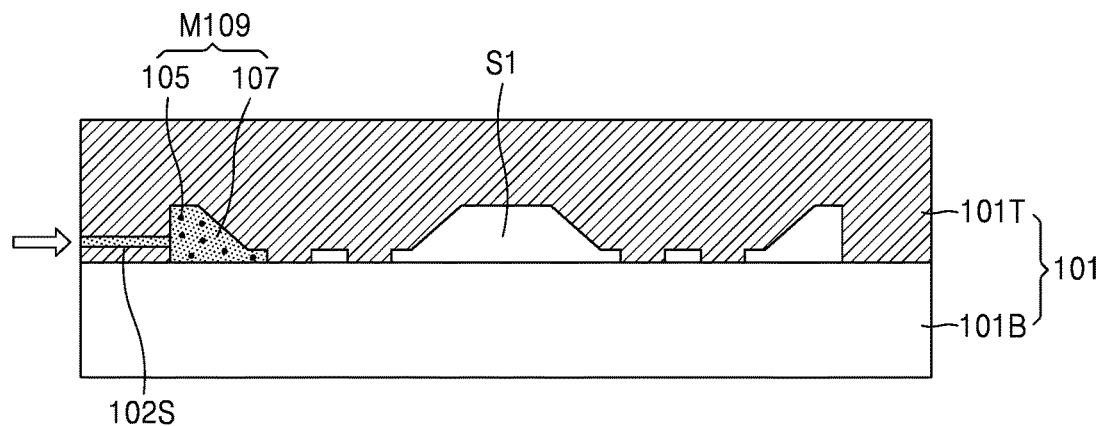
FIGS. 5A to 5K are cross-sectional views illustrating a method of manufacturing an LED package, according to an exemplary embodiment of the present disclosure.

Referring to FIG. 5A, a mold 101 for defining a reflective structure panel having a plurality of cavities may be prepared. The mold 101 may include a lower mold 101B for defining the bottom surface of a bottom portion of the reflective structure panel and an upper mold 101T for defining a reflective structure panel having a plurality of cavities on the lower mold 101B.

The reflective structure panel that is formed by a molding process method may be implemented as it is according to a shape defined by the mold 101. Therefore, the mold 101 may be manufactured in advance according to the reflective structure panel to be formed.

The upper mold 101T may be formed such that the inner side surface of the cavity has a slope at a predetermined angle. In addition, the upper mold 101T may be formed to define a through hole into which an electrode pad may be inserted.

The upper mold 101T may include an injection path 102S for injecting a molding material M109 and a discharge path (not shown) through which the remaining molding material M109 may be discharged after the mold 101 is filled.

The molding material M109 may be injected into the mold 101. The molding material M109 may include a resin 107 and a highly reflective powder 105 dispersed in the resin 107. The molding material M109 is injected into the mold 101 at a high temperature and may be injected until a space S1 defined by the lower mold 101B and the upper mold 101T is completely filled.

The operation of injecting the molding material M109 into the mold 101 may be performed in a vacuum state. Accordingly, the molding material M109 may be easily injected into the mold 101 without a void.

Figure 5B:
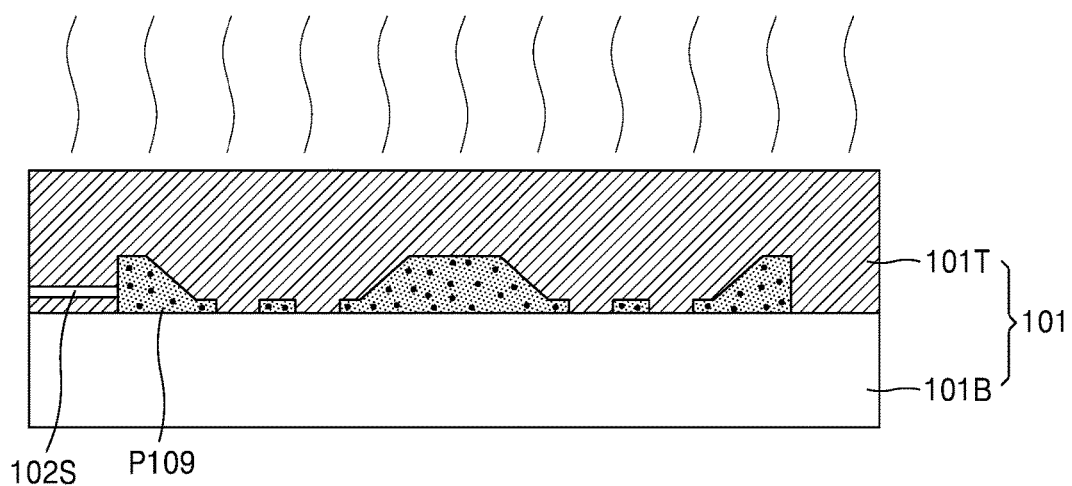

Referring to FIG. 5B, when the molding material M109 is completely filled in the space S1 (see FIG. 5A) defined by the lower mold 101B and the upper mold 101T, the molding material M109 may be cured.

Thus, a reflective structure panel P109 having a plurality of cavities may be manufactured. The reflective structure panel P109 may include a plurality of reflective structures, each of which includes a sidewall portion having an inclination angle and a bottom portion having a through hole formed therein.

Figure 5C:
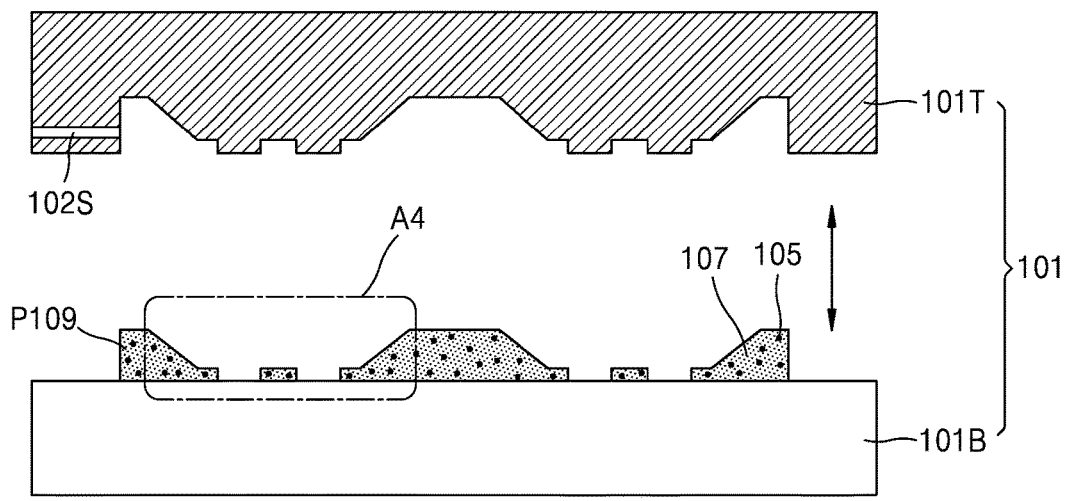

Referring to FIG. 5C, the reflective structure panel P109 may be separated from the mold 101. As described above, since the reflective structure panel P109 includes the resin 107 and the highly reflective powder 105 dispersed therein, the reflective structure panel P109 may have flexibility. For example, even if the reflective structure panel P109 has a large area with a plurality of cavities, the reflective structure panel P109 may be prevented from being damaged in the operation of separating the reflective structure panel P109 from the mold 101. Therefore, according to the method of manufacturing the LED package according to one embodiment of the present disclosure, it is possible to efficiently mass-produce the reflective structure panel P109, thereby increasing the mass productivity of the LED package.

Figure 5D:
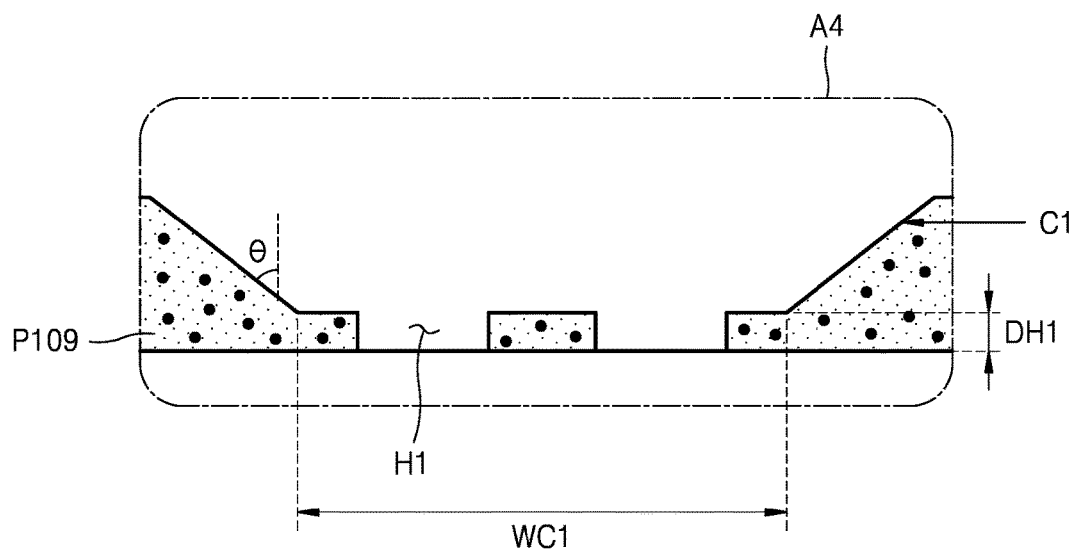

FIG. 5D is an enlarged view of a portion A4 of FIG. 5C, and referring to FIG. 5D, the shapes of a cavity C1 and a through hole H1 implemented according to the shape of the upper mold 101T are specifically shown. The inclination angle $\theta$ of the inner side surface of the reflective structure panel P109, the width WC1 of the bottom surface of the cavity C1 in which an LED is disposed, and the depth DH1 of the through hole H1 in which an electrode pad is disposed may be determined by the shape of the mold 101.

Depending on the shape of the upper mold 101T, the inclination angle $\theta$ of the inner side surface of the reflective structure panel P109 may be about 45° to about 55° providing maximum light reflection efficiency.

In addition, the width WC1 of the bottom surface of the cavity C1 may have a minimum width to minimize the volume of the reflective structure panel P109. For example, the width WC1 of the bottom surface of the cavity C1 may be greater than the width of the LED, but may be formed to have a minimum interval. In some embodiments, the depth DH1 of the through hole H1 may be the same as the thickness of the electrode pad (e.g., as described above with reference to FIGS. 1 and 1B). Alternatively, the depth DH1 of the through hole H1 may be greater than the thickness of the electrode pad (e.g., as described above with reference to FIGS. 2A and 2B).

Figure 5E:
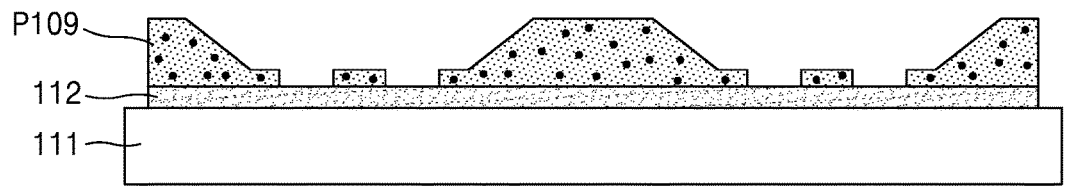

Referring to FIG. 5E, the reflective structure panel P109 may be attached to a carrier substrate 111 by using an adhesive layer 112. The carrier substrate 111 may support the reflective structure panel P109.

The adhesive layer 112 may be used to improve adhesion between the carrier substrate 111 and the reflective structure panel P109. The adhesive layer 112 may include a polymer based material. For example, adhesive layer 112 may include fluoropolymer, polyurethane, acrylic, epoxy, silicone, styrene, ethylene, butylene, styrene block copolymer or the like.

In some embodiments, the adhesive layer 112 may include a volatile adhesive material. In this exemplary embodiment, the adhesive layer 112 may include an adhesive and a solvent. Some of the solvent in the adhesive layer 112 may be partially volatilized as a high temperature process is performed. Therefore, voids may partially be generated in the adhesive layer 112. The adhesive layer 112 may be formed to have a predetermined thickness by a forming process. In some other embodiments, the adhesive layer 112 may be a UV adhesive layer.

Figure 5F:
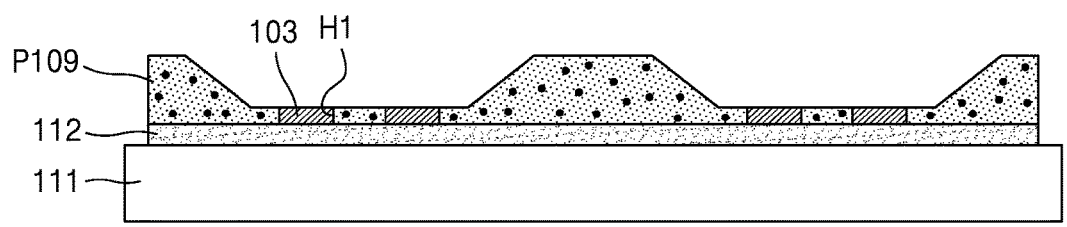

Referring to FIG. 5F, an electrode pad 103 may be formed in each of a plurality of through holes H1. As described above, the depth of the through hole H1 may be the same as the thickness of the electrode pad 103. Alternatively, the depth of the through hole H1 may be greater than the thickness of the electrode pad 103.

The electrode pad 103 may include a conductive material such as Ag, Ni, Al, Rh, Pd, Ir, Ru, Mg, Zn, Pt, or Au and may have a structure including two or more layers such as Ni/Ag, Zn/Ag, Ni/Al, Zn/Al, Pd/Ag, Pd/Al, Ir/Ag. Ir/Au, Pt/Ag, Pt/Al, or Ni/Ag/Pt.

In some embodiments, the operation of forming the electrode pad 103 may include forming a seed layer including a metal material such as Ni or Cr, and forming an electrode material such as Au on the seed layer by using a plating process.

Figure 5G:
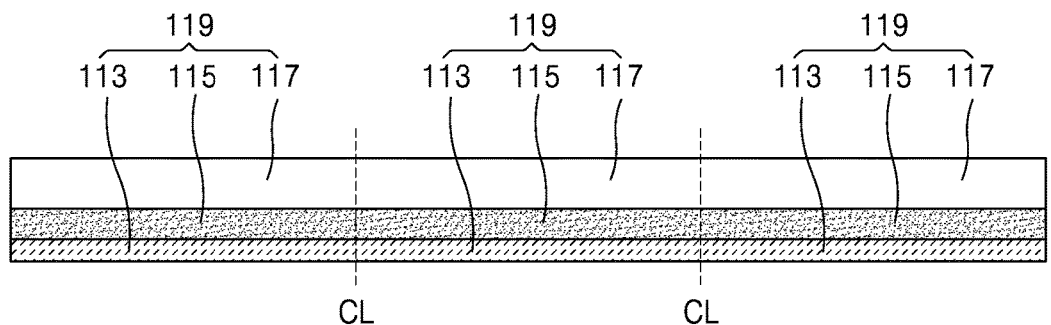

Referring to FIG. 5G, an LED 119 may be provided in a form including a light-emitting structure 113, a phosphor 115, and a support substrate 117 by a series of semiconductor processes. Individually separated LEDs 119 may be obtained by cutting along a cutting line CL using a mechanical cutter or a laser cutter. The cutting line CL is a virtual line for separating the LEDs 119 individually. Thus, the side surface of the light-emitting structure 113, the side surface of the phosphor 115, and the side surface of the support substrate 117 may be positioned in substantially the same plane.

Figure 5H:
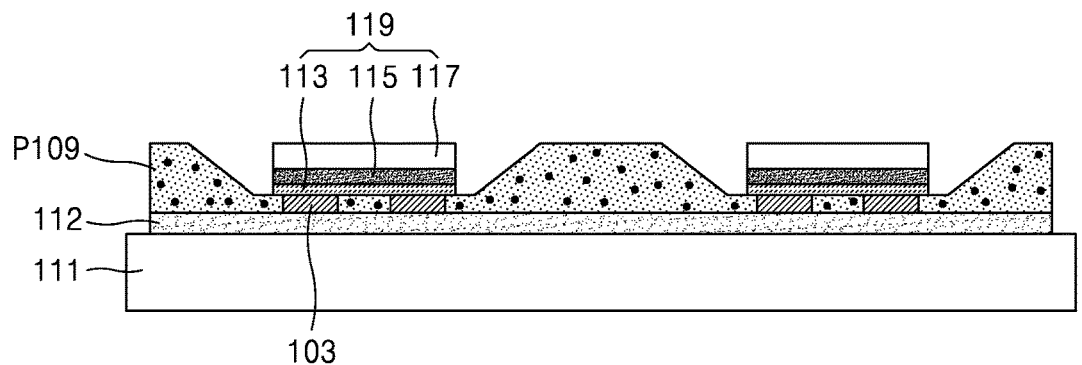

Referring to FIG. 5H, each of the plurality of LEDs 119 may be disposed on the reflective structure panel P109. In this exemplary embodiment, the light-emitting structure 113 of the LED 119 may be disposed to be electrically connected to the electrode pad 103. In addition, the light-emitting structure 113 of the LED 119 may be disposed on the bottom surface of the cavity.

As described above, the level of the top surface of the LED 119 may be substantially equal to the level of the top surface of the reflective structure panel P109. In addition, the level of the top surface of the phosphor 115 may be lower than the level of the top surface of the reflective structure panel P109.

Figure 5I:
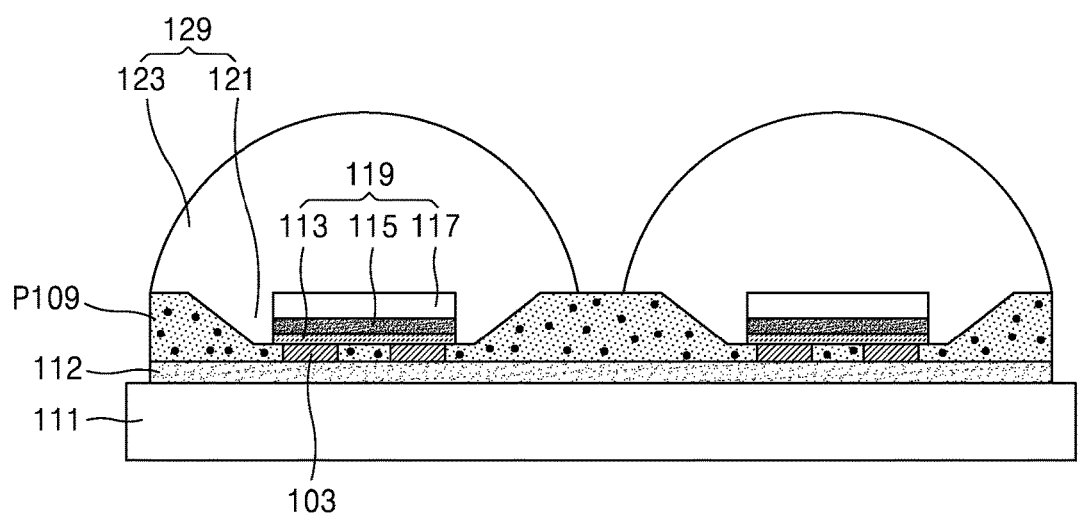

Referring to FIG. 5I, a plurality of lens structures 129, each of which includes a first region 121 filling a cavity and a second region 123 being a microlens formed on the reflective structure panel P109, may be formed.

A light-transmitting material forming the first region 121 of the lens structure 129 may protect the LED 119 from an external environment. The light-transmitting material may be formed to seal the LED 119.

The first region 121 and the second region 123 of the lens structure 129 are separately described for convenience of description. However, the first region 121 and the second region 123 may include the same material and may be formed in a single process. For example, the first region 121 and the second region 123 of the lens structure 129 may be integrally formed at the same time by using a compression molding method.

The microlens may have various surface shapes corresponding to an orientation angle required for the LED package according to one embodiment of the present disclosure. In some embodiments, the microlenses may have various geometries such as concave, convex, unevenness, and cone, and light distribution characteristics may be modified according to the shape of the microlens.

In addition, adjacent microlenses may be spaced apart by a predetermined interval. This is to prevent the shape of the microlens from being damaged from a subsequent cutting process.

Figure 5J:
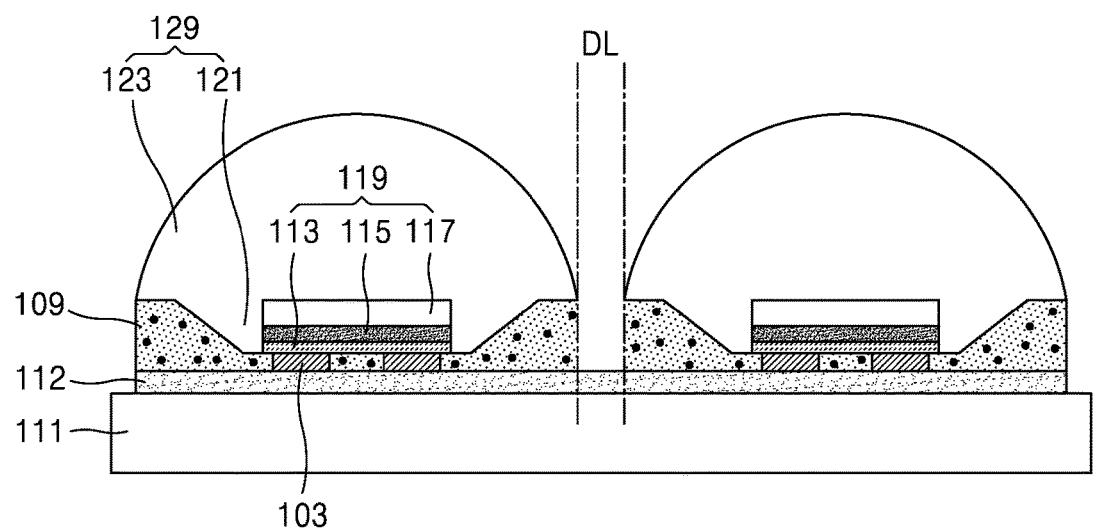

Referring to FIG. 5J, the reflective structure panel P109 (see FIG. 5I) having a large area may be subjected to a cutting process along a cutting lane DL to be physically separated into respective reflective structures 109.

The cutting process may be performed by passing a sawing blade along the cutting lane DL. In the cutting process, only the reflective structure panel P109 may be cut and a part of an adhesive layer 112 may also be cut.

Figure 5K:
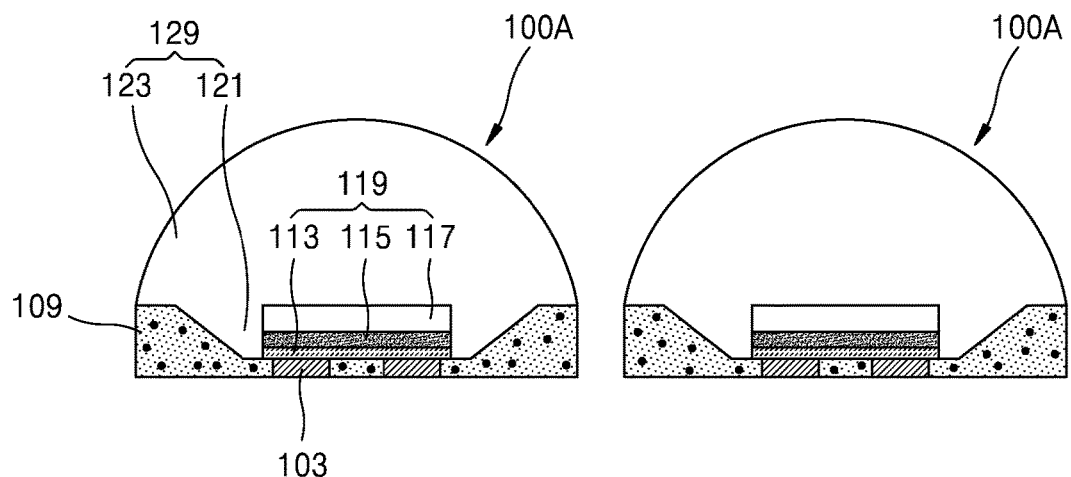

Referring to FIG. 5K, a plurality of LED packages 100A are separated from the carrier substrate 111 (see FIG. 5J). When the residue of the adhesive layer 112 (see FIG. 5J) remains on the bottom surface of the reflective structure 109 after the plurality of LED packages 100A are separated from the carrier substrate 111, a process of removing the residue may be additionally performed.

Through the process, a chip scale LED package 100A including the LED 119 may be manufactured.

According to the method of manufacturing the LED package 100A according to one embodiment of the present disclosure, it is possible to easily manufacture the reflective structure 109 having a sidewall portion inclined by a molding method and a bottom portion having a through hole formed therein. The LED package 100A to which the reflective structure 109 is applied may effectively increase the light extraction efficiency of the LED package 100A by easily adjusting an inclination angle of the reflective structure 109. In addition, since the reflective structure 109 of the LED package 100A may be manufactured at a panel level at a time by using the molding method, the LED package 100A may be mass-produced efficiently.

The process of manufacturing the LED package 100B (see FIG. 2A) is almost the same as the process of manufacturing the LED package 100A except that the electrode pad 103 is filled only in a portion of the through hole H1 in the process step illustrated in FIG. 5F.

In addition, the process of manufacturing the LED package 100C (see FIG. 3A) is almost the same as the process of manufacturing the LED package 100A except that the support substrate 117 is not formed in the process step illustrated in FIG. 5G.

Figure 6:
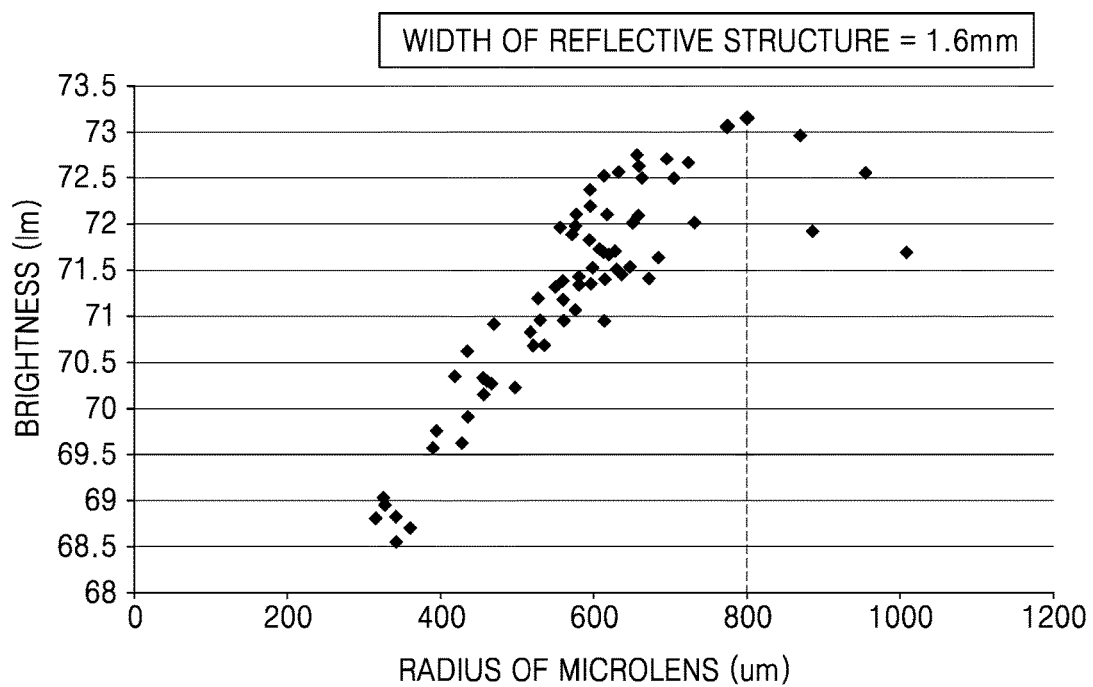
FIG. 6 is a graph showing a relationship between the microlens radius and the brightness of an LED package according to an exemplary embodiment of the present disclosure.

FIG. 6 is a graph showing a relationship between the microlens radius and the brightness of an LED package according to an embodiment of the present disclosure.

Referring to FIG. 6, the luminance of the LED package is measured while changing the microlens radius.

In order to use an LED package as a light source, a high luminance characteristic of the LED package may be desirable. Accordingly, in the LED package according to one embodiment of the present disclosure, the brightness is measured in relation to the width of the reflective structure while changing the microlens radius.

The width of the reflective structure in the LED package is fixed to about 1.6 mm in order to measure the brightness of the LED package, and the brightness of the LED package is measured while increasing the microlens radius from about 300 µm to about 1000 µm.

As a result of the measurement, the brightness of the LED package is the highest at the microlens radius of about 800 µm to about 73.2 lm, which corresponds to half of the width of the reflective structure. For example, the closer the microlens is to a spherical shape, the higher the brightness of the LED package is measured.

Consequently, by minimizing the width of the reflective structure by using the LED package manufacturing method according to one embodiment of the present disclosure, the radius of the microlens may be minimized and the LED package may be further miniaturized.

Figure 7:
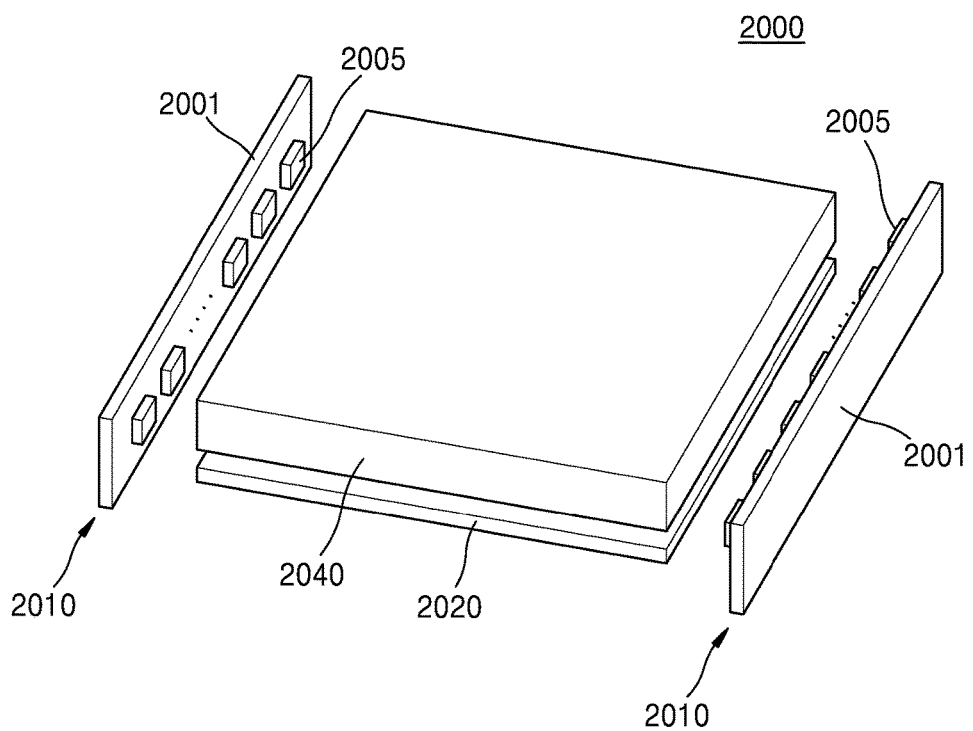
FIG. 7 is a perspective view of a backlight unit including an LED package according to an exemplary exemplary embodiment of the present disclosure.

FIG. 7 is a perspective view of a backlight unit 2000 including an LED package according to an exemplary embodiment of the present disclosure.

Referring to FIG. 7, the backlight unit 2000 may include a light guide plate 2040 and light source modules 2010 on both sides of the light guide plate 2040. In addition, the backlight unit 2000 may further include a reflective plate 2020 under the light guide plate 2040. The backlight unit 2000 according to one exemplary embodiment may be an edge-type backlight unit. According to some exemplary embodiments, the light source module 2010 may be provided only one side surface of the light guide plate 2040 or may be additionally provided on the other side. The light source module 2010 may include a printed circuit board (PCB) 2001 and a plurality of light sources 2005 mounted on the PCB 2001. The light source 2005 may be the LED package 100A, 100B, or 100C according to the above-described exemplary embodiments.

Figure 8:
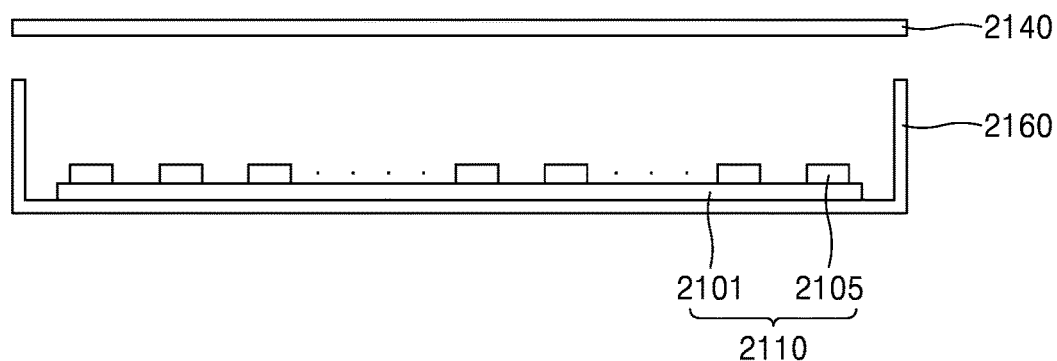
FIG. 8 is a cross-sectional view of a direct-type backlight unit including an LED package according to an exemplary embodiment of the present disclosure.

FIG. 8 is a cross-sectional view of a direct-type backlight unit 2100 including an LED package according to an exemplary embodiment of the present disclosure.

Referring to FIG. 8, the backlight unit 2100 may include a light diffusion plate 2140 and a light source module 2110 under the light diffusion plate 2140. In addition, the backlight unit 2100 may further include a bottom case 2160 under the light diffusion plate 2140 to accommodate the light source module 2110. The backlight unit 2100 according to one exemplary embodiment may be a direct-type backlight unit.

The light source module 2110 may include a PCB 2101 and a plurality of light sources 2105 mounted on the PCB 2101. The light source 2105 may be the LED package 100A, 100B, or 100C according to the above-described exemplary embodiments.

Figure 9:
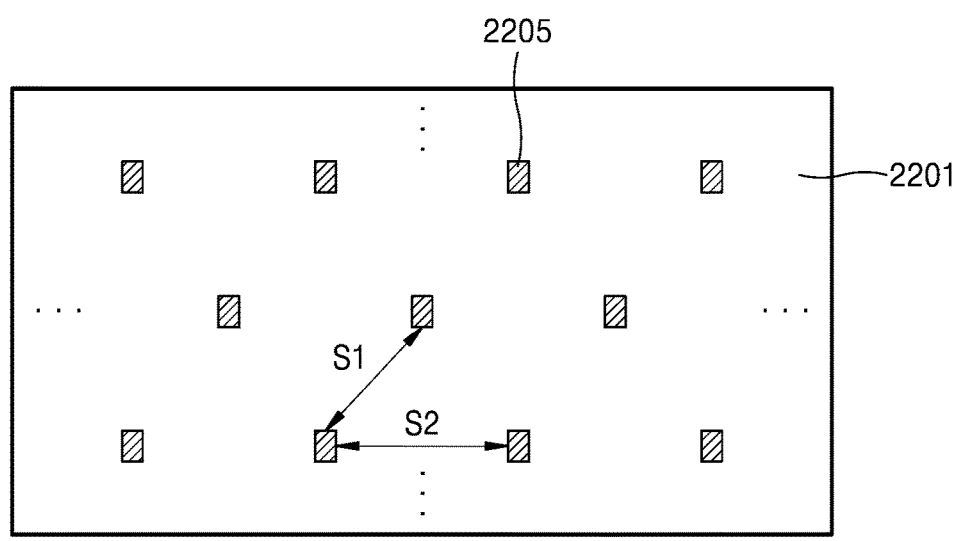
FIG. 9 is a plan view of a backlight unit including an LED package according to an exemplary embodiment of the present disclosure.

FIG. 9 is a plan view of a backlight unit 2200 including an LED package according to an exemplary embodiment of the present disclosure.

FIG. 9 illustrates an example of an arrangement of a light source 2205 in a direct-type backlight unit 2200. The light source 2205 may be the LED package 100A, 100B, or 100C according to the above-described exemplary embodiments.

The direct-type backlight unit 2200 according to one exemplary embodiment may include a plurality of light sources 2205 arranged on a substrate 2201. The light sources 2205 may be arranged in a matrix form, of which rows and columns are in a zigzag arrangement. A second matrix having the same shape may be arranged in a first matrix in which the plurality of light sources 2205 are arranged in rows and columns on a straight line. It may be understood that the light sources 2205 included in the second matrix are inside a rectangle formed by four adjacent light sources 2205 included in the first matrix.

In the direct-type backlight unit, the arrangement structure and intervals of the first matrix and the second matrix may be different so as to further improve brightness uniformity and optical efficiency thereof. Besides the method of arranging the plurality of light sources, distances S1 and S2 between the adjacent light sources may be optimized so as to ensure the brightness uniformity. In this manner, the rows and columns on which the light sources 2205 are arranged may be in a zigzag arrangement, instead of the straight line, thus reducing the number of light sources 2205 by about 15% to about 25% with respect to the same light emission area.

Figure 10:
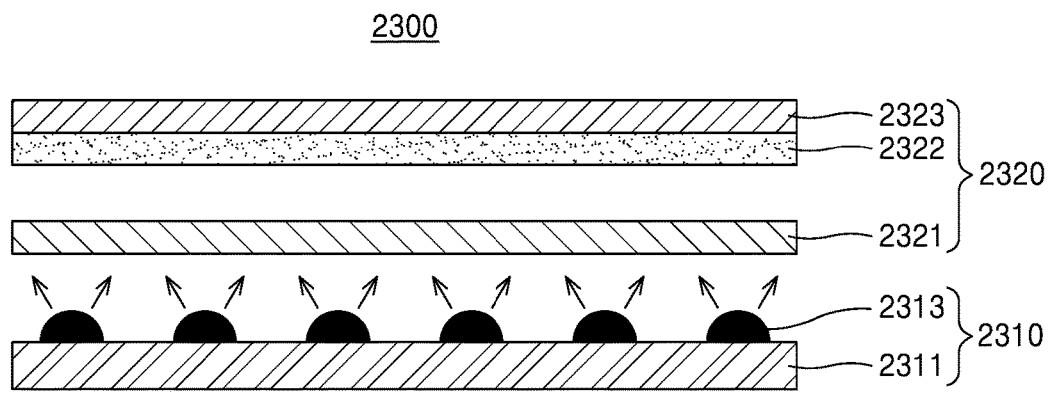
FIG. 10 is a cross-sectional view of a direct-type backlight unit including an LED package according to an exemplary embodiment of the present disclosure.
Figure 11:
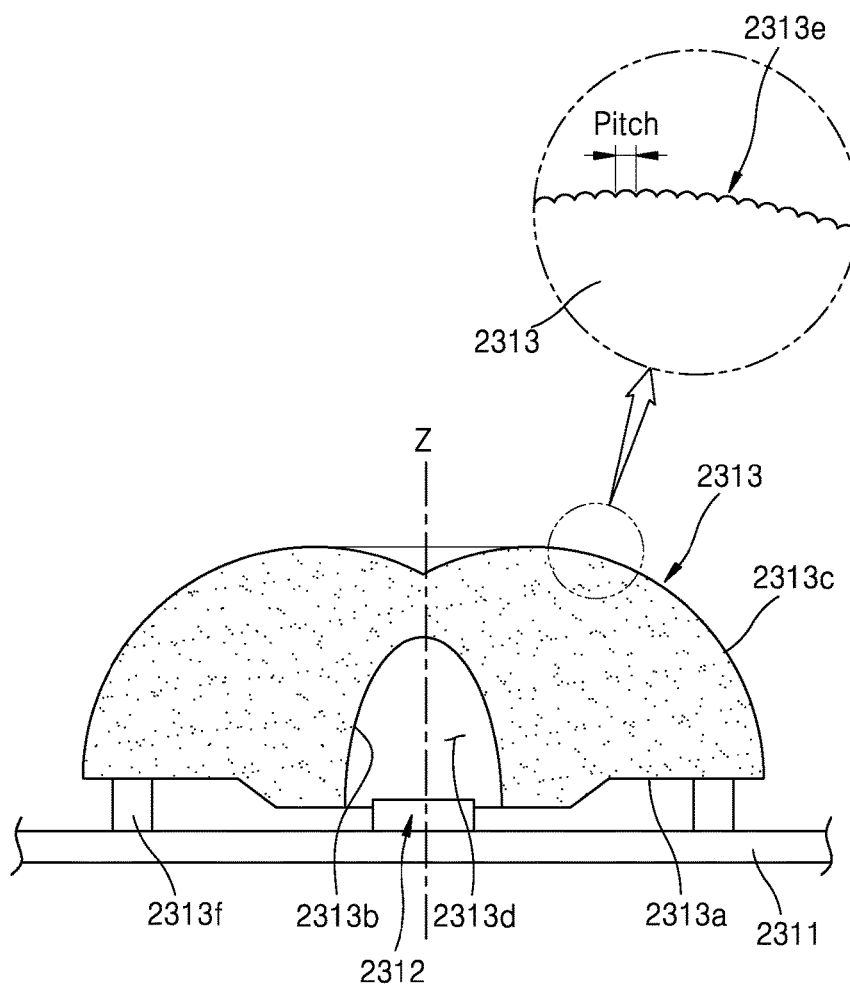
FIG. 11 is an enlarged view of a light source module of FIG. 10.

FIG. 10 is a cross-sectional view of a direct-type backlight unit 2300 including an LED package according to an exemplary embodiment of the present disclosure, and FIG. 11 is an enlarged view of a light source module 2310 of FIG. 10.

Referring to FIG. 10, the direct-type backlight unit 2300 according to one exemplary embodiment may include an optical sheet 2320 and a light source module 2310 under the optical sheet 2320. The optical sheet 2320 may include a diffusion sheet 2321, a light concentration sheet 2322, and a protection sheet 2323.

The light source module 2310 may include a circuit board 2311, a plurality of light sources 2312 mounted on the circuit board 2311, and a plurality of optical elements 2313 respectively on the plurality of light sources 2312. The light source 2312 may be the LED package 100A, 100B, or 100C according to the above-described exemplary embodiments.

The optical element 2313 may adjust an orientation angle of light through reflection. In particular, a light orientation-angle lens configured to diffuse light of the light source 2312 to a wide region may be used. Since the light source 2312, to which the optical element 2313 is attached, has a wider light distribution, the number of light sources 2312 per the same area may be reduced when the light source module 2310 is used in a backlight or a flat-panel lighting apparatus.

As illustrated in FIG. 11, the optical element 2313 may include a bottom surface 2313a on the light source 2312, an incidence surface 2313b on which the light of the light source 2312 is incident, and an exit surface 2313c from which the light is output. The bottom surface 2313a of the optical element 2313 may have a groove 2313d recessed in a direction of the exit surface 2313c in a center through which an optical axis Z of the light source 2312 passes. The groove 2313*d* may be defined as an incidence surface 2313*b* on which the light of the light source 2312 is incident. For example, the incidence surface 2313*b* may form a surface of the groove 2313*d*.

The bottom surface 2313*a* of the optical element 2313 may partially protrude toward the light source 2312 in a central portion connected to the incidence surface 2313*b* to thereby have a non-planar structure as a whole. For example, unlike a general flat structure, the entire bottom surface 2313*a* of the optical element 2313 may partially protrude along a periphery of the groove 2313*d*. A plurality of supports 2313*f* may be provided on the bottom surface 2313*a* of the optical element 2313. When the optical element 2313 is mounted on the circuit board 2311, the plurality of supports 2313*f* may fix and support the optical element 2313.

The exit surface 2313*c* of the optical element 2313 may protrude upward (a light exit direction) from an edge connected to the bottom surface 2313*a* in a dome shape, and have an inflection point such that a center through which the optical axis Z passes is concavely recessed toward the groove 2313*d*. A plurality of concave/convex portions 2313*e* may be periodically arranged on the exit surface 2313*c* in a direction of the edge from the optical axis Z. The plurality of concave/convex portions 2313*e* may have a ring shape corresponding to a horizontal cross-sectional shape of the optical element 2313 and may form a concentric circle from the optical axis Z. The plurality of concave/convex portions 2313*e* may be radially arranged while forming periodic patterns along the surface of the exit surface 2313*c* from the center of the optical axis Z.

The plurality of concave/convex portions 2313*e* may be spaced apart by regular pitches to form patterns. In this exemplary embodiment, the pitch between the plurality of concave/convex portions 2313*e* may be in the range of about 0.01 mm to about 0.04 mm. The plurality of concave/convex portions 2313*e* may offset a difference of performance between the optical elements due to a fine processing error that may occur in the process of manufacturing the optical element 2313, and may improve the uniformity of the light distribution accordingly.

Figure 12:
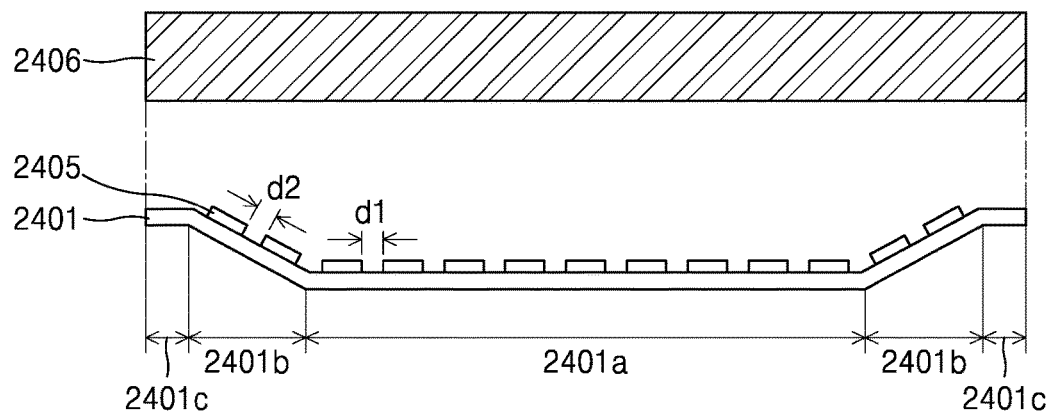
FIG. 12 is a cross-sectional view of a direct-type backlight unit including an LED package according to an exemplary embodiment of the present disclosure.

FIG. 12 is a cross-sectional view of a direct-type backlight unit 2400 including an LED package according to an exemplary embodiment of the present disclosure.

Referring to FIG. 12, the direct-type backlight unit 2400 may include a circuit board 2401, a light source 2405 mounted on the circuit board 2401, and one or more optical sheets 2406 on the light source 2405. The light source 2405 may be a white light-emitting device including a red phosphor. The light source 2405 may be a module mounted on the circuit board 2401. The light source 2405 may be the LED package 100A, 100B, or 100C according to the above-described exemplary embodiments.

The circuit board 2401 may have a first flat portion 2401*a* corresponding to a main region, an inclined portion 2401*b* arranged around the first flat portion 2401*a* and bent in at least a portion thereof, and a second flat portion 2401*c* arranged at an edge of the circuit board 2401 that is an outside of the inclined portion 2401*b*. The light sources 2405 may be arranged at a first interval d1 on the first flat portion 2401*a*, and one or more light sources 2405 may also be arranged at a second interval d2 on the inclined portion 2401*b*. The first interval d1 may be substantially equal to the second interval d2. A width (or a length in a cross-section) of the inclined portion 2401*b* may be smaller than a width of the first flat portion 2401*a* and greater than a width of the second flat portion 2401*c*. In addition, at least one light source 2405 may be arranged on the second flat portion 2401*c* when necessary.

A slope of the inclined portion 2401*b* may be appropriately adjusted in the range of greater than 0° and less than 90° with reference to the first flat portion 2401*a*. Due to such a configuration, the circuit board 2401 may maintain uniform brightness even at the edge of the optical sheet 2406.

Figure 13:
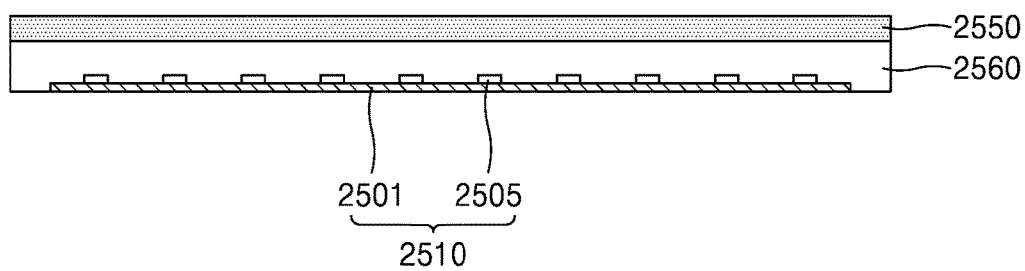
FIGS. 13 to 15 are cross-sectional views of backlight units including an LED package according to an exemplary embodiment of the present disclosure.
Figure 14:
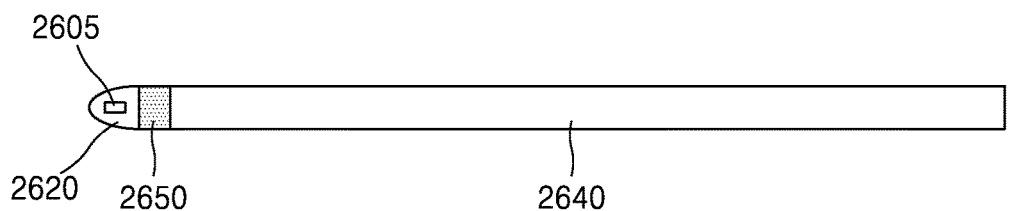
Figure 15:
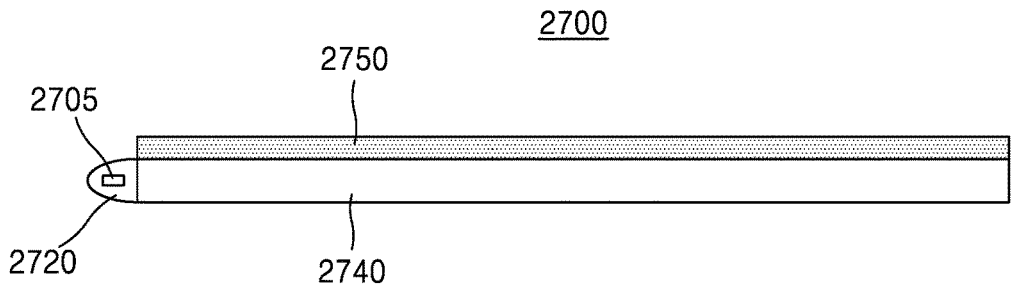

FIGS. 13 to 15 are cross-sectional views of backlight units 2500, 2600, and 2700 including an LED package according to an exemplary embodiment of the present disclosure.

In the backlight units 2500, 2600, and 2700, wavelength conversion units 2550, 2650, and 2750 are not arranged in light sources 2505, 2605, and 2705. The wavelength conversion units 2550, 2650, and 2750 are arranged in the backlight units 2500, 2600, and 2700 outside the light sources 2505, 2605, and 2705 so as to convert light. The light sources 2505, 2605, and 2705 may be the LED package 100A, 100B, or 100C according to the above-described exemplary embodiments.

The backlight unit 2500 of FIG. 13 is a direct-type backlight unit and may include the wavelength conversion unit 2550, a light source module 2510 under the wavelength conversion unit 2550, and a bottom case 2560 accommodating the light source module 2510. In addition, the light source module 2510 may include a PCB 2501 and a plurality of light sources 2505 mounted on the PCB 2501.

In the backlight unit 2500, the wavelength conversion unit 2550 may be on the bottom case 2560. Therefore, at least a part of the light emitted by the light source module 2510 may be wavelength-converted by the wavelength conversion unit 2550. The wavelength conversion unit 2550 may be manufactured as a separate film and may be integrated with a light diffusion plate (not shown).

The backlight units 2600 and 2700 of FIGS. 14 and 15 are edge-type backlight units and may respectively include the wavelength conversion unit 2650 and 2750, light guide plates 2640 and 2740, and reflection units 2620 and 2720 and light sources 2605 and 2705 arranged on one side of the light guide plates 2640 and 2740. The light emitted by the light sources 2605 and 2705 may be guided respectively inside the light guide plates 2640 and 2740 by the reflection units 2620 and 2720, respectively. In the backlight unit 2600 of FIG. 14, the wavelength conversion unit 2650 may be arranged between the light guide plate 2640 and the light source 2605. In the backlight unit 2700 of FIG. 15, the wavelength conversion unit 2750 may be on a light emission surface of the light guide plate 2740.

The wavelength conversion units 2550, 2650, and 2750 may include typical phosphors. Also, quantum dots may replace use of a phosphor by itself or may be mixed with a phosphor (such as those described herein) and may also be employed as a wavelength conversion material for the embodiments described herein. For example, quantum dot phosphors may be used for supplementing characteristics of quantum dots vulnerable to moisture or heat from the light source.

Figure 16:
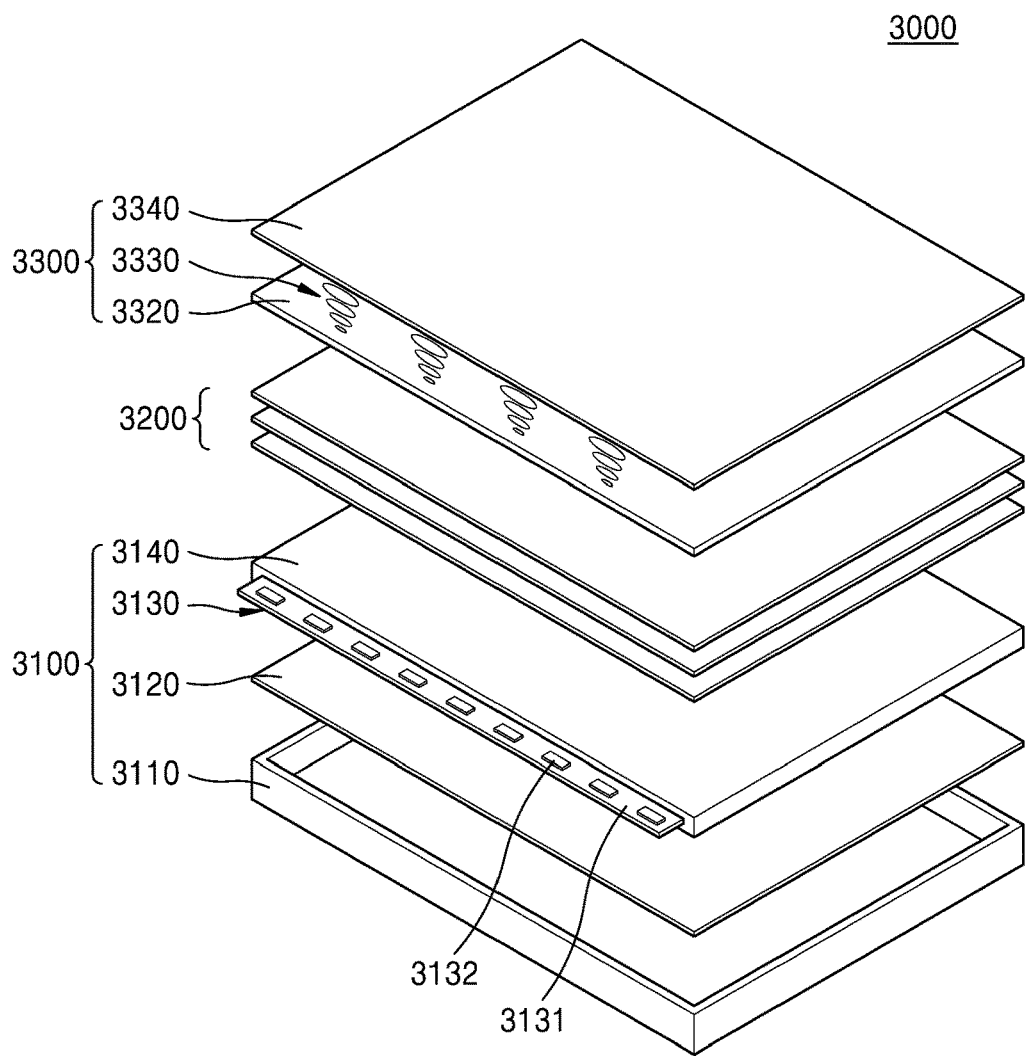
FIG. 16 is an exploded perspective view of a display device including an LED package according to an exemplary embodiment of the present disclosure.

FIG. 16 is an exploded perspective view of a display device 3000 including an LED package according to an exemplary embodiment of the present disclosure.

Referring to FIG. 16, the display device 3000 may include a backlight unit 3100, an optical sheet 3200, and a display panel 3300 such as a liquid crystal panel. The backlight unit 3100 may include a bottom case 3110, a reflection plate 3120, a light guide plate 3140, and a light source module 3130 on at least one side of the light guide plate 3140. The light source module 3130 may include a PCB 3131 and a light source 3132.

In particular, the light source 3132 may be a side view type LED mounted on a side adjacent to a light emission surface. The light source 3132 may be the LED package 100A, 100B, or 100C according to the above-described exemplary embodiments. The optical sheet 3200 may be between the light guide plate 3140 and the display panel 3300 and may include various types of sheets, such as a diffusion sheet, a prism sheet, or a protection sheet.

The display panel 3300 may display an image by using light emitted from the optical sheet 3200. The display panel 3300 may include an array substrate 3320, a liquid crystal layer 3330, and a color filter substrate 3340. The array substrate 3320 may include pixel electrodes arranged in a matrix form, thin film transistors configured to apply a driving voltage to the pixel electrodes, and signal lines configured to operate the thin film transistors.

The color filter substrate 3340 may include a transparent substrate, a color filter, and a common electrode. The color filter may include filters configured to selectively transmit light having a specific wavelength in white light emitted by the backlight unit 3100. The liquid crystal layer 3330 may be rearranged by an electric field formed between the pixel electrode and the common electrode and adjust an optical transmittance. The light, of which the optical transmittance is adjusted, may display an image while passing through the color filter of the color filter substrate 3340. The display panel 3300 may further include a driving circuit configured to process an image signal.

According to one exemplary embodiment, since the display device 3000 uses the light source 3132 configured to emit blue light, green light, and red light having a relatively small half-width, the emitted light may implement blue, green, and red colors having a high color purity after passing through the color filter substrate 3340.

Figure 17:
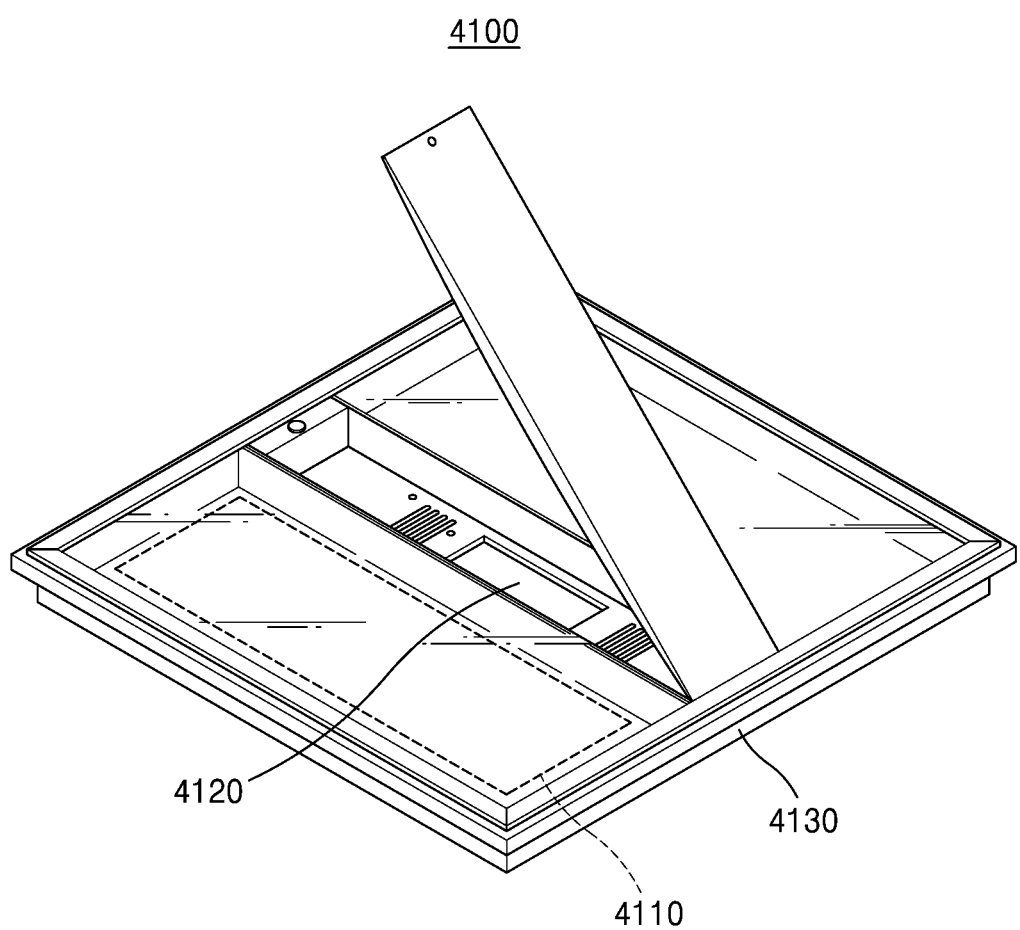
FIG. 17 is a perspective view of a flat-panel lighting apparatus including an LED package according to an exemplary embodiment of the present disclosure.

FIG. 17 is a perspective view of a flat-panel lighting apparatus 4100 including an LED package according to an exemplary embodiment of the present disclosure.

Referring to FIG. 17, the flat-panel lighting apparatus 4100 may include a light source module 4110, a power supply 4120, and a housing 4030. The light source module 4110 may include an LED array as a light source. The light source module 4110 may be the LED package 100A, 100B, or 100C according to the above-described exemplary embodiments. The power supply 4120 may include an LED driver.

The light source module 4110 may include an LED array and may be formed to have a flat shape as a whole. The LED array may include an LED and a controller configured to store driving information of the LED.

The power supply 4120 may be configured to supply power to the light source module 4110. The power supply 4120 according to some exemplary embodiments can include circuit components on a printed circuit board. For example, the power supply 4120 may include circuit components configured to generate or convert power and supply the power to the light source module 4110. Alternatively, the power supply 4120 may be electrical wiring in a building, for example, connected to a power line, generator, transformer, battery, or other power source, or may refer to the generator, battery, transformer, etc. The housing 4130 may form an accommodation space for accommodating the light source module 4110 and the power supply 4120. The housing 4130 is formed to have a hexahedral shape with one opened side, but is not limited thereto. The light source module 4110 may be arranged to emit light toward the opened side of the housing 4130.

Figure 18:
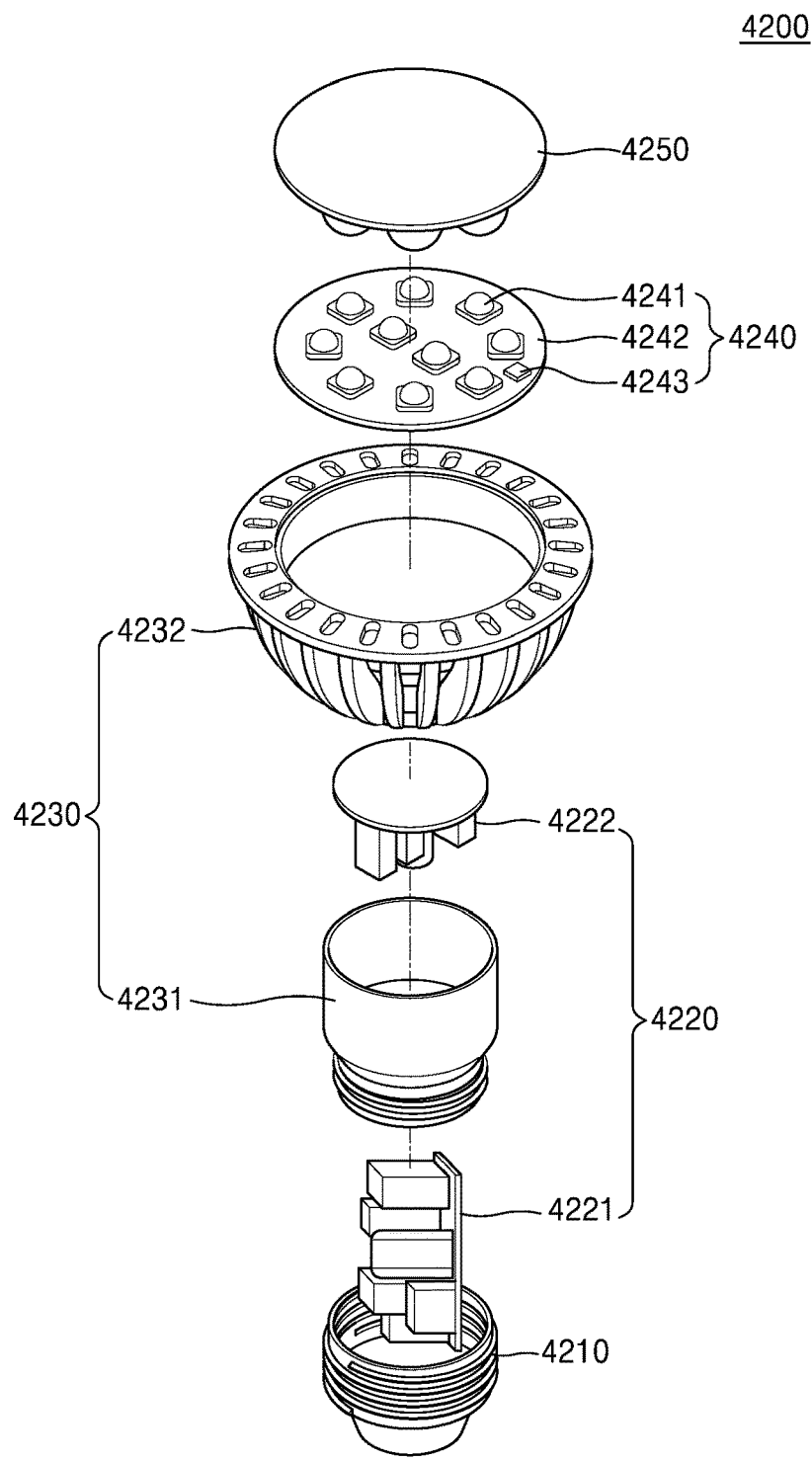
FIG. 18 is an exploded perspective view of a lighting apparatus including an LED package according to an exemplary embodiment of the present disclosure.

FIG. 18 is an exploded perspective view of a lighting apparatus 4200 including an LED package according to an exemplary embodiment of the present disclosure.

Referring to FIG. 18, the lighting apparatus 4200 may include a socket 4210, a power supply 4220, a heat sink 4230, a light source module 4240, and an optical unit 4250. The light source module 4240 may include an LED array, and the power supply 4220 may include an LED driver. The power supply 4220 may have the same components as described above with respect to the power supply 4120.

The socket 4210 may be configured to be replaceable with an existing lighting apparatus. Power may be supplied to the lighting apparatus 4200 through the socket 4210. The power supply 4220 may be dissembled into a first power supply 4221 and a second power supply 4220. The heat sink 4230 may include an internal heat sink 4231 and an external heat sink 4232. The internal heat sink 4231 may be directly connected to the light source module 4240 and/or the power supply 4220. The internal heat sink 4231 may transmit heat to the external heat sink 4232. The optical unit 4250 may include an internal optical unit (not illustrated) and an external optical unit (not illustrated). The optical unit 4250 may be configured to uniformly disperse light emitted by the light source module 4240.

The light source module 4240 may receive power from the power supply 4220 and emit light to the optical unit 4250. The light source module 4240 may include one or more LED packages 4241, a circuit board 4242, and controller 4243. The controller 4243 may store driving information of the LED packages 4241. The LED packages 4241 may be the LED packages 100A, 100B, or 100C according to the above-described exemplary embodiments.

Figure 19:
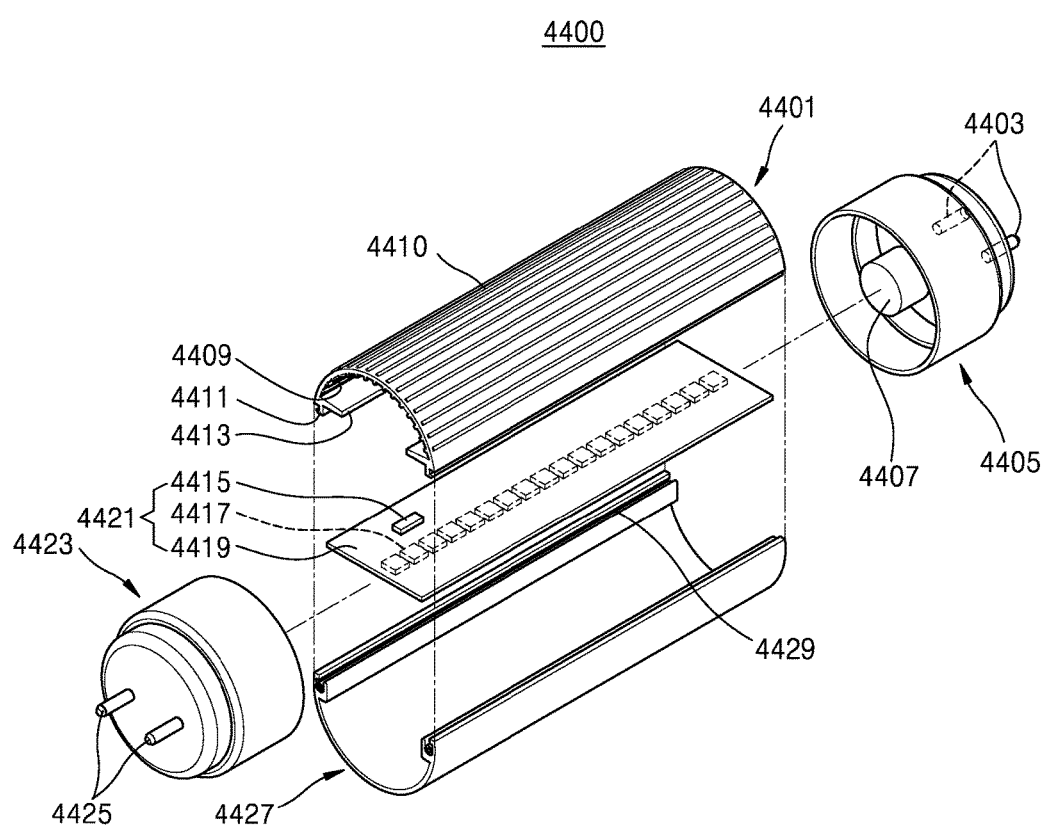
FIG. 19 is an exploded perspective view of a bar-type lighting apparatus including an LED package according to an exemplary embodiment of the present disclosure.

FIG. 19 is an exploded perspective view of a bar-type lighting apparatus 4400 including an LED package according to an exemplary embodiment of the present disclosure.

Referring to FIG. 19, the bar-type lighting apparatus 4400 may include a heat sink member 4401, a cover 4427, a light source module 4421, a first socket 4405, and a second socket 4423. A plurality of heat sink fins 4409 and 4410 having a concave/convex shape may be formed on inner or outer surfaces of the heat sink member 4401. The heat sink fins 4409 and 4410 may be designed to have various shapes and intervals. A support 4413 having a protruding shape may be formed inside the heat sink member 4401. The light source module 4421 may be fixed to the support 4413. Locking protrusions 4411 may be formed on both ends of the heat sink member 4401.

Locking grooves 4429 may be formed in the cover 4427. The locking protrusions 4411 of the heat sink member 4401 may be hooked to the locking grooves 4429. The positions of the locking grooves 4429 may be exchanged with the positions of the locking protrusions 4411.

The light source module 4421 may include an LED array. The light source module 4421 may include a PCB 4419, a light source 4417, and a controller 4415. The controller 4415 may store driving information of the light source 4417. Circuit wirings may be formed on the PCB 4419 so as to operate the light source 4417. In addition, the light source module 4421 may include components for operating the light source 4417. The light source 4417 may be the LED package 100A, 100B, or 100C according to the exemplary embodiments of the present disclosure.

The first and second sockets 4405 and 4423 may be provided as a pair of sockets and may be connected to both ends of a cylindrical cover unit including the heat sink member 4401 and the cover 4427. For example, the first socket 4405 may include an electrode terminal 4403 and a power supply 4407, and the second socket 4423 may include a dummy terminal 4425. In some instances, the dummy terminal 4425 may not be connected or configured to receive a normal terminal voltage that would be applied to the electrode terminal 4403 (e.g., it may receive a different voltage level, or may receive a voltage at a different time from when a voltage is applied to electrode terminal 4403). In addition, an optical sensor module and/or a communication module may be embedded into the first socket 4405 or the second socket 4423. For example, the optical sensor module and/or the communication module may be embedded into the second socket 4423 in which the dummy terminal 4425 is arranged. As another example, the optical sensor module and/or the communication module may be embedded into the first socket 4405 in which the electrode terminal 4403 is arranged.

Figure 20:
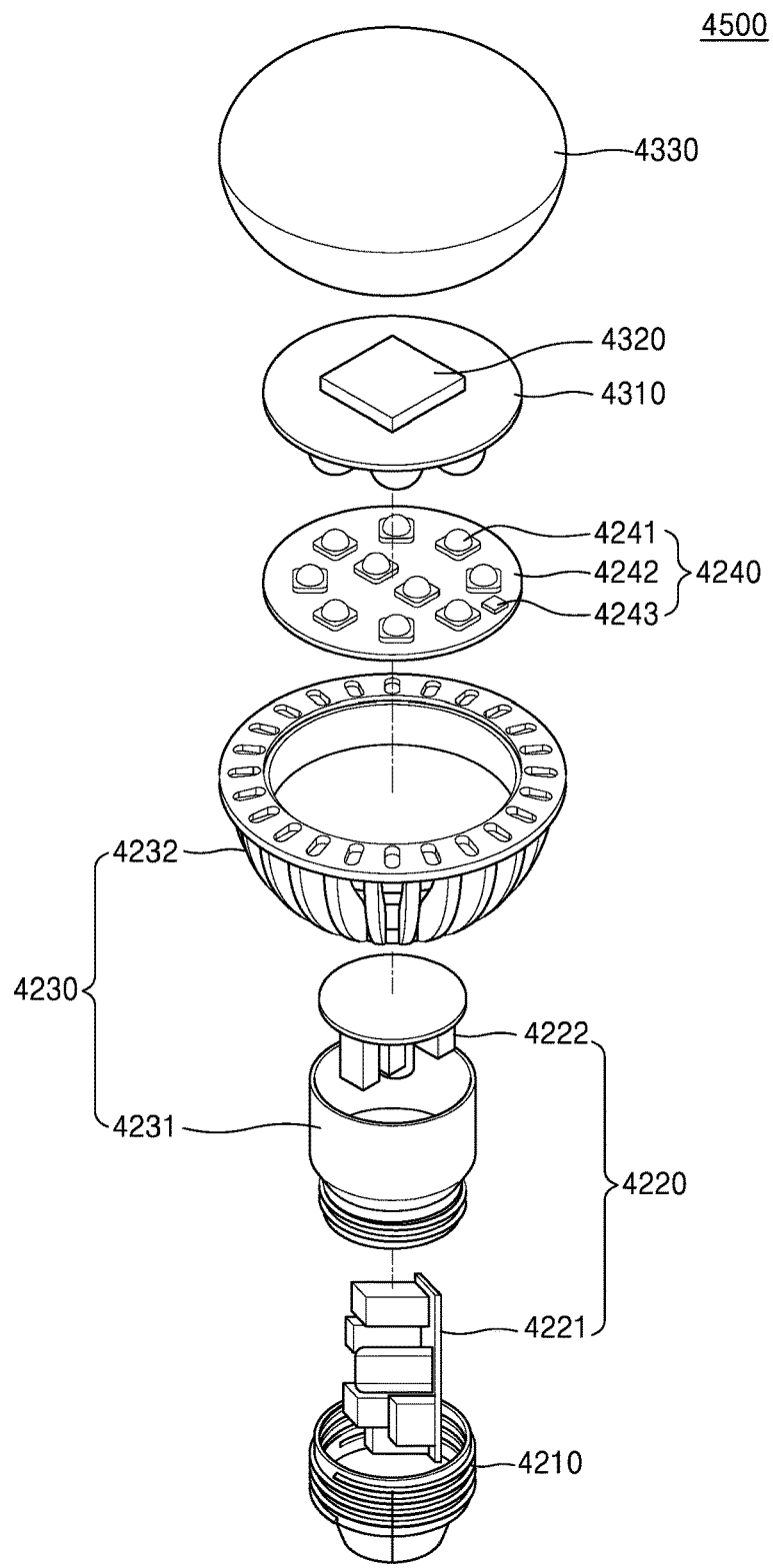
FIG. 20 is an exploded perspective view of a lighting apparatus including an LED package according to an exemplary embodiment of the present disclosure.

FIG. 20 is an exploded perspective view of a lighting apparatus 4500 including an LED package according to an exemplary embodiment of the present disclosure.

The lighting apparatus 4500 of FIG. 20 differs from the lighting apparatus 4200 of FIG. 18 in that a reflection plate 4310 and a communication module 4320 are provided on a light source module 4240. The reflection plate 4310 may uniformly disperse light from the light source in a lateral direction and a rearward direction so as to reduce glare.

The communication module 4320 may be mounted on the reflection plate 4310, and a home network communication may be performed through the communication module 4320. For example, the communication module 4320 may be a wireless communication module using ZigBee, WiFi, or LiFi, and control an indoor or outdoor lighting apparatus, such as on/off operations or brightness adjustment of the lighting apparatus through a smartphone or a wireless controller. In addition, electronic appliances and vehicle systems, such as TVs, refrigerators, air conditioners, doorlock systems, vehicles, may be controlled through a LiFi communication module using a wavelength of visible light in the indoor or outdoor lighting apparatus. The reflection plate 4310 and the communication module 4320 may be covered by the cover 4330.

While the present disclosure has been particularly shown and described with reference to embodiments thereof, it will be understood that various changes in form and details may be made therein without departing from the spirit and scope of the following claims.

What is claimed is:

1. A method of manufacturing a light-emitting diode (LED) package, the method comprising:
preparing a mold defined to include a plurality of shapes of a reflective structure comprising a cavity, a bottom portion having a through hole, and a sidewall portion surrounding the cavity and the bottom portion, the sidewall portion having an inclined inner side surface;
forming a reflective structure panel comprising a plurality of reflective structures by using the mold;
forming an electrode pad in a through hole formed in a bottom portion of each of the plurality of reflective structures;
arranging an LED on the bottom portion of each of the plurality of reflective structures, the LED comprising a light-emitting structure electrically connected to the electrode pad and a phosphor formed on the light-emitting structure; and
forming a lens structure filling the cavity, the lens structure comprising a microlens on each of the plurality of reflective structures.

2. The method of claim 1, wherein the forming the reflective structure panel comprises:
injecting a molding material into the mold in a vacuum state, the molding material comprising a resin and a reflective powder having relatively high reflectivity dispersed in the resin; and
curing the molding material.

3. The method of claim 2, wherein the reflective powder is $TiO_2$, $Al_2O_3$, $Nb_2O_5$, or ZnO.

4. The method of claim 1, wherein, in the forming the reflective structure panel, a depth of the through hole is equal to or greater than a thickness of the electrode pad in a direction perpendicular to a bottom surface of the reflective structure.

5. The method of claim 1, further comprising, after the forming the reflective structure panel, affixing the reflective structure panel to a carrier substrate by using an adhesive layer.

6. The method of claim 1, wherein, in the arranging the LED, a level of a top surface of the phosphor in a direction perpendicular to a bottom surface of the reflective structure is lower than a level of a top surface of the reflective structure in the direction perpendicular to the bottom surface of the reflective structure.

7. The method of claim 1, wherein, in the arranging the LED, a side surface of the light-emitting structure and a side surface of the phosphor are positioned in the same plane.

8. The method of claim 1, wherein, in the arranging the LED, the LED further comprises a support substrate formed on the phosphor.

9. The method of claim 1, wherein, in the forming the lens structure, a material filling the cavity and a material forming the microlens are the same material.

10. The method of claim 1, wherein, in the forming the lens structure, a radius of the microlens is half a width of the reflective structure in a direction parallel to a bottom surface of the reflective structure.

11. The method of claim 1, further comprising, after the forming the lens structure, cutting the reflective structure panel into a plurality of reflective structures.

12. A method of manufacturing a light-emitting diode (LED) package, the method comprising:
preparing a mold defined to include a plurality of shapes of a reflective structure, wherein the reflective structure comprises a cavity, a bottom portion having a through hole, and a sidewall portion surrounding the cavity and the bottom portion, the sidewall portion having an inclined inner side surface;
forming a reflective structure panel comprising a plurality of reflective structures by using the mold;
forming an electrode pad in a through hole formed in a bottom portion of each of the plurality of reflective structures;
arranging an LED on the bottom portion of each of the plurality of reflective structures, the LED being electrically connected to the electrode pad; and
forming a lens structure filling the cavity, the lens structure comprising a microlens formed hemispherically on an upper flat portion of each of the plurality of reflective structures.

13. The method of claim 12, wherein the forming the reflective structure panel comprises:

injecting a molding material into the mold in a vacuum state, the molding material comprising a resin and a highly reflective powder dispersed in the resin; and curing the molding material.

14. The method of claim 12, wherein, in the forming of the lens structure, a material filling the cavity and a material forming the microlens are the same.

15. The method of claim 12, further comprising, after the forming of the lens structure, cutting the reflective structure panel into the plurality of reflective structures.

16. The method of claim 15, wherein a width of each of the plurality of the reflective structures is substantially equal to a width of the lens structure.

17. A method of manufacturing a light-emitting diode (LED) package, the method comprising:

preparing a mold defined to include a plurality of shapes of a reflective structure, wherein the reflective structure comprises a cavity, a bottom portion having a first through hole and a second through hole spaced apart from each other, and a sidewall portion surrounding the cavity and the bottom portion, the sidewall portion having an inclined inner side surface;

forming a reflective structure panel comprising a plurality of reflective structures by using the mold;

forming a first electrode pad in the first through hole and a second electrode pad in the second through hole, in a bottom portion of each of the plurality of reflective structures;

arranging an LED on the bottom portion of each of the plurality of reflective structures, the LED comprising a light-emitting structure, a phosphor formed on the light-emitting structure, and a support substrate formed on the phosphor and having a top surface substantially identical to a top surface of each of the plurality of reflective structures, wherein, in the light-emitting structure, a first conductive semiconductor layer, an active layer, and a second conductive semiconductor layer are sequentially stacked, the first conductive semiconductor layer is connected to the first electrode pad, and the second conductive semiconductor layer is connected to the second electrode pad; and forming a lens structure filling the cavity, the lens structure comprising a microlens on each of the plurality of reflective structures.

18. The method of claim 17, wherein the forming of the reflective structure panel comprises:

injecting a molding material into the mold in a vacuum state, the molding material comprising a highly reflective powder selected from $TiO_2$, $Al_2O_3$, $Nb_2O_5$, and ZnO; and curing the molding material.

19. The method of claim 17, wherein, in the forming of the reflective structure panel, depths of the first and second through holes are equal to or greater than thicknesses of the first and second electrode pads.

20. The method of claim 17, wherein, in the forming of the lens structure, the lens structure comprises a microlens formed hemispherically on an upper flat portion of each of the plurality of reflective structures.

* * * * *